(12) United States Patent
Lee et al.

(10) Patent No.: US 12,477,813 B2
(45) Date of Patent: Nov. 18, 2025

(54) METAL GATES FOR MULTI-GATE SEMICONDUCTOR DEVICES AND METHOD THEREOF

(71) Applicant: TAIWAN SEMICONDUCTOR MANUFACTURING COMPANY, LTD., Hsinchu (TW)

(72) Inventors: Chih-Wei Lee, New Taipei (TW); Jo-Chun Hung, Hsinchu (TW); Wen-Hung Huang, Hsin-Chu (TW); Jian-Hao Chen, Hsinchu (TW); Kuo-Feng Yu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 707 days.

(21) Appl. No.: 17/832,649

(22) Filed: Jun. 5, 2022

(65) Prior Publication Data

US 2023/0395435 A1    Dec. 7, 2023

(51) Int. Cl.

| H01L 21/02  | (2006.01) |
|---|---|
| H01L 21/28  | (2025.01) |
| H10D 30/01  | (2025.01) |
| H10D 30/43  | (2025.01) |
| H10D 30/67  | (2025.01) |
| H10D 62/10  | (2025.01) |
| H10D 84/01  | (2025.01) |
| H10D 84/03  | (2025.01) |
| H10D 84/85  | (2025.01) |

(52) U.S. Cl.
CPC ..... *H10D 84/038* (2025.01); *H01L 21/02603* (2013.01); *H01L 21/28088* (2013.01); *H10D 30/014* (2025.01); *H10D 30/031* (2025.01); *H10D 30/43* (2025.01); *H10D 30/6735* (2025.01); *H10D 30/6739* (2025.01); *H10D 30/6757* (2025.01); *H10D 62/121* (2025.01); *H10D 84/0167* (2025.01); *H10D 84/0177* (2025.01); *H10D 84/85* (2025.01)

(58) Field of Classification Search
None
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

*Primary Examiner* — Sue A Purvis
*Assistant Examiner* — Jordan M Klein
(74) *Attorney, Agent, or Firm* — HAYNES AND BOONE, LLP

(57) ABSTRACT

A method includes providing a structure having a first stack of nanostructures spaced vertically one from another and a second stack of nanostructures spaced vertically one from another, forming a dielectric layer wrapping around each of the nanostructures in the first and second stacks, depositing an n-type work function layer on the dielectric layer and a p-type work function layer on the n-type work function layer and over the first and second stacks. The n-type work function layer wraps around each of the nanostructures in the first stack. The p-type work function layer wraps around each of the nanostructures in the second stack. The method also includes forming an electrode layer on the p-type work function layer and over the first and second stacks.

20 Claims, 31 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2020/0243522 A1* | 7/2020 | Cheng .................. H10D 30/024 |
| 2020/0294805 A1* | 9/2020 | Wu .................... H01L 21/28176 |
| 2021/0082918 A1* | 3/2021 | Cheng ................. H01L 21/0228 |
| 2021/0280687 A1 | 9/2021 | Lai et al. |

\* cited by examiner

METAL GATES FOR MULTI-GATE SEMICONDUCTOR DEVICES AND METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the gate-all-around transistor (GAA). The GAA transistor gets its name from the gate structure which can extend around the channel region providing access to the channel on two or four sides. GAA transistors are compatible with conventional complementary metal-oxide-semiconductor (CMOS) processes and their structure allows them to be aggressively scaled while maintaining gate control and mitigating SCEs. In conventional processes, GAA transistors provide a channel in stacked nanostructures (e.g., nanosheet, nanowire, or nanorod) configuration. Integration of fabricating the GAA features around stacked nanostructures can be challenging. For example, as device feature sizes continue to decrease, work function (WF) layers wrapping adjacent stacked nanostructures may easily fill the space vertically therebetween, leaving limited room in a gate trench to fine tune threshold voltage (Vt) of the transistor. Therefore, while processes for multi-gate device formation have generally been adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
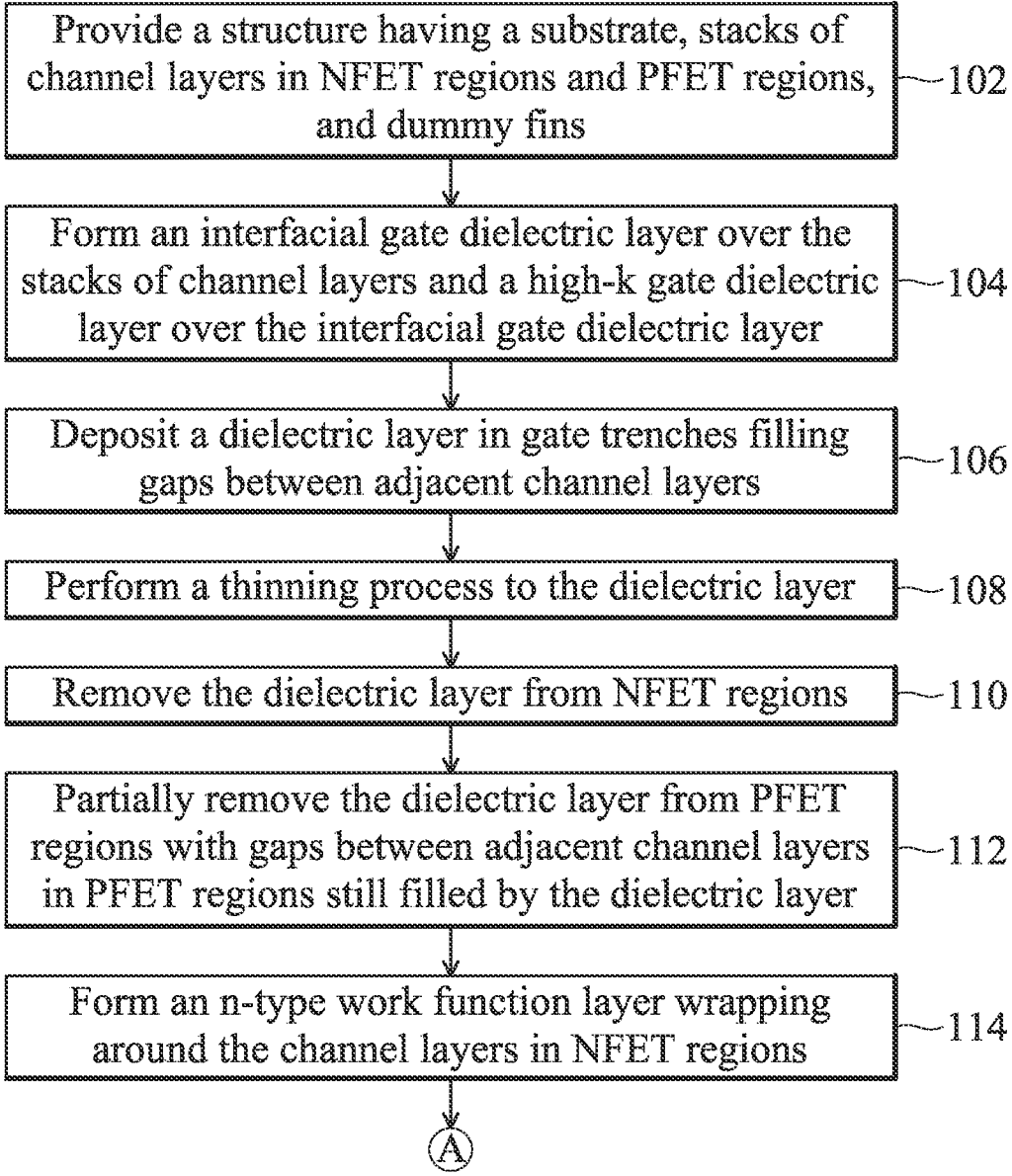
FIGS. 1A and 1B illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include an n-type metal-oxide-semiconductor device or a p-type metal-oxide-semiconductor multi-gate device. Specific examples herein may be presented to a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configuration. Presented herein are embodiments of devices that may have one or more channels (e.g., stacked nanostructures in form of nanosheets or nanowires) associated with a single, contiguous gate structure (e.g., a high-k metal gate, also referred to as HKMG). However, one of ordinary skill would recognize that the teaching can apply to a single channel or any number of channels, such as a FinFET device, on account of its fin-like structure. One of ordinary skill may recognize other examples of semiconductor devices that may benefit from aspects of the present disclosure.

To offer GAA transistors with different threshold voltages (such as standard Vt, low Vt, and so on), the formation of HKMG for GAA transistors includes depositing certain material layers, called work function (WF) layers, wrapping the vertically stacked channels. Through WF layers, transistors with different compositions of HKMG, thus different Vts, can be formed. As the semiconductor fabrication process progresses to smaller geometries, the vertical space between channels of GAA transistors becomes smaller and the horizontal space between channels and nearby structures (such as dummy fins or another GAA transistor) becomes smaller, forming HKMG for GAA devices has become more and more challenging. For example, it becomes difficult to deposit different WF layers to achieve different Vts, as the initial deposition of WF layers may have filled the limited space vertically between the channels. This problem is exacerbated for certain IC applications where n-type field effect transistor (NFET) performance may be more important than p-type field effect transistor (PFET) performance, such as Static Random Access Memory (SRAM) devices. This is because conventional methods of fabricating transistors form PFETs before NFETs, often leaving no room to fine tune WF layers for NFETs. Thus, forming HKMG in conventional methods may require stringent process control.

The present disclosure utilizes a method that requires a less stringent process control than the above approaches. In an embodiment of the present disclosure, WF layers for NFETs (also referred to as n-type WF layers) is formed before WF layers for PFETs (also referred to as p-type WF layers), allowing p-type WF layers to be deposited on n-type WF layers. The p-type WF layers are able to fine tune n-type WF layers, such as n-type WF metal oxidation rate. As such, the present disclosure may improve device performance, for example, providing different Vts for different regions of the device, particularly for IC applications such as SRAMs. The details of the fabrication methods and the structures of the present disclosure are described by referring to the accompanied figures.

Figure 1B:
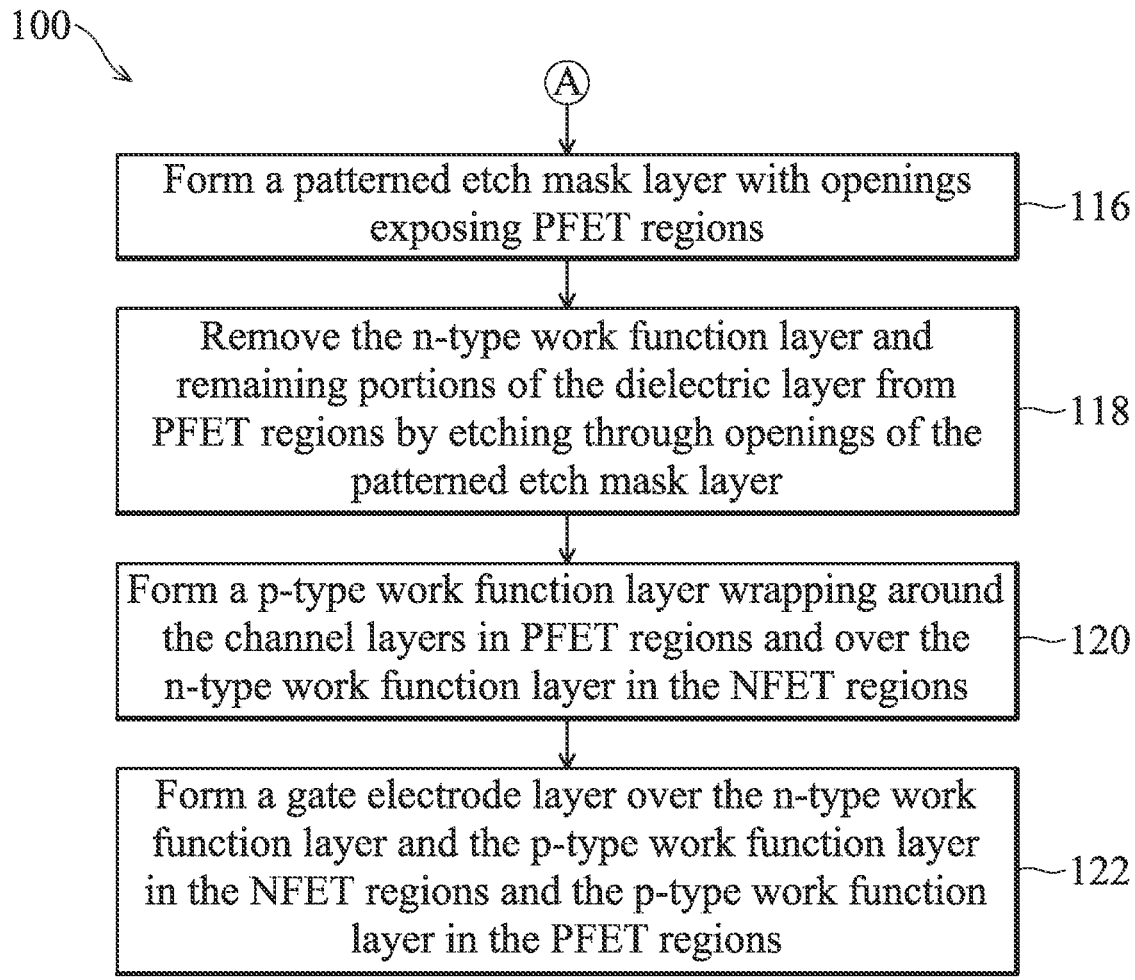
Figure 2:
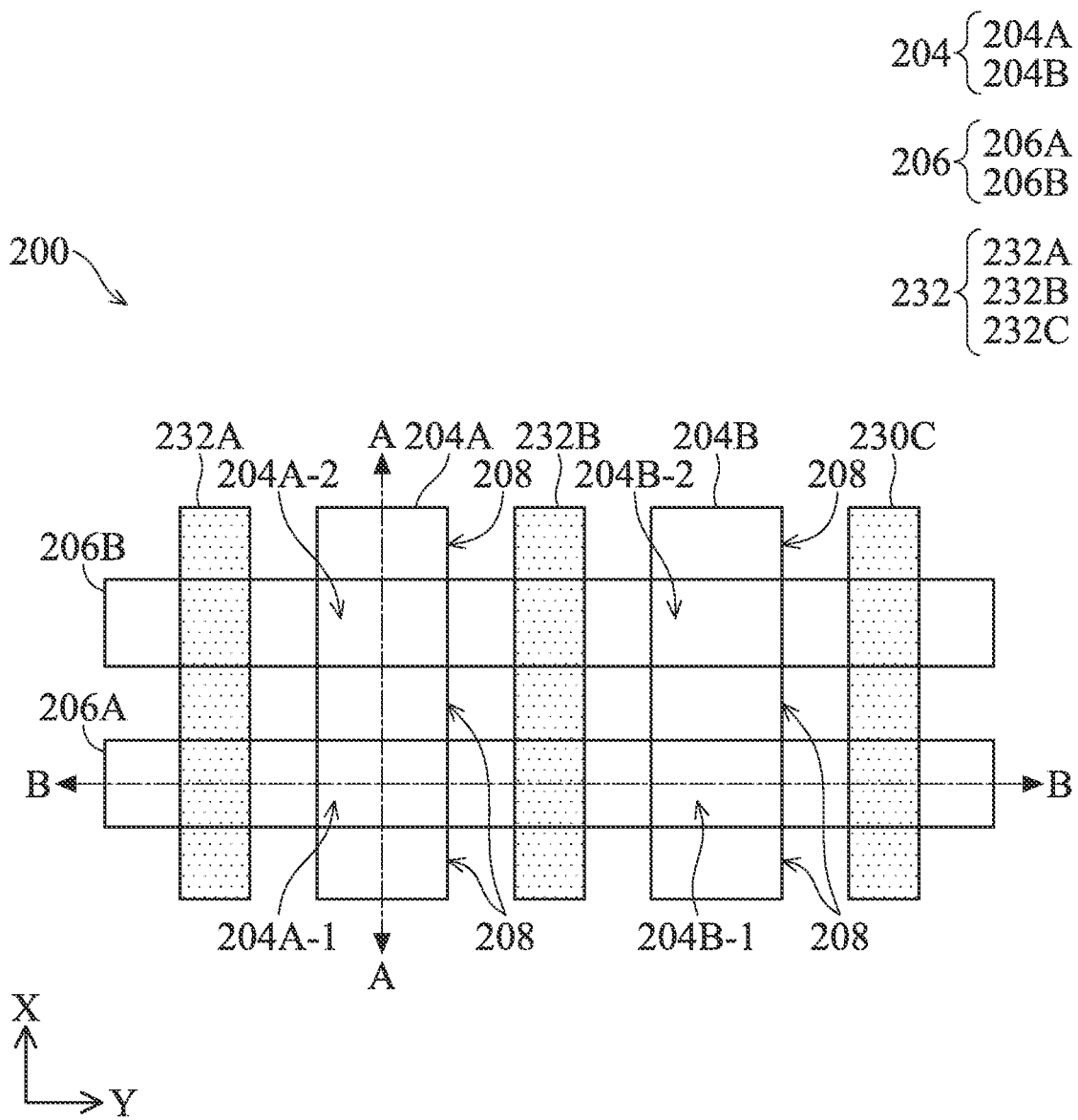
FIG. 2 is a diagrammatic top view of a semiconductor device, in portion, according to various aspects of the present disclosure.
Figure 15A:
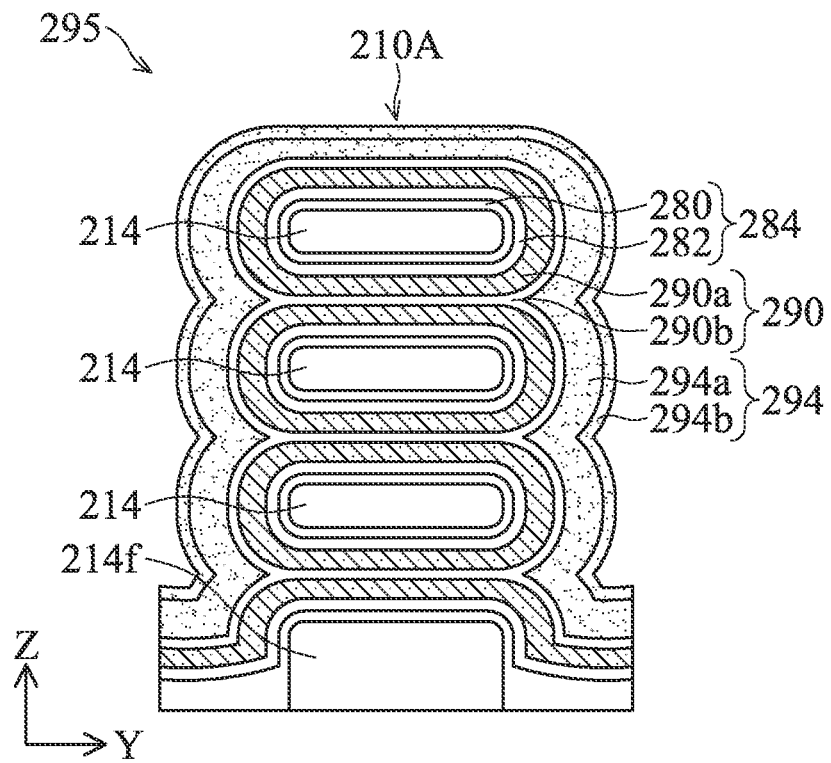
FIGS. 15A, 15B, 15C, 15D are fragmentary cross-sectional views of a stack of channel layers in an NFET region of the semiconductor device in FIG. 2 in accordance with some embodiments of the present disclosure.
Figure 16:
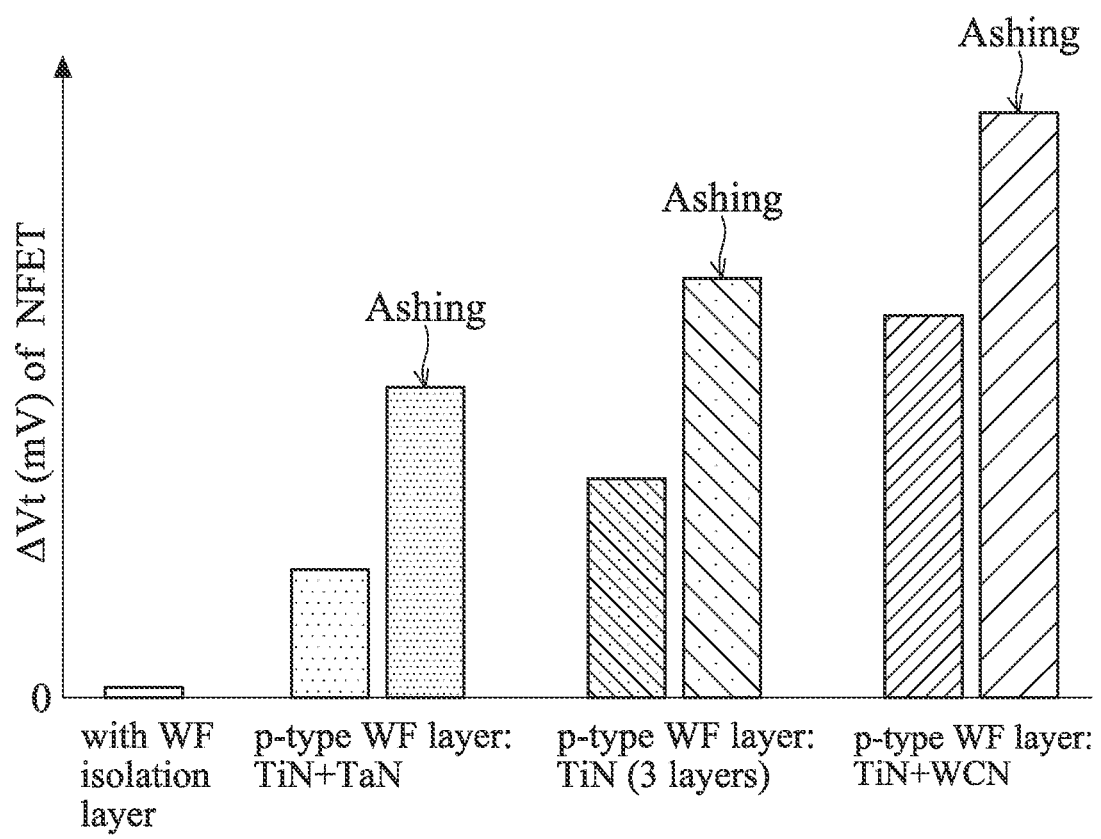
FIG. 16 is a bar chart illustrating effects of NFET Vt tuning in accordance with some embodiments of the present disclosure.
Figure 17:
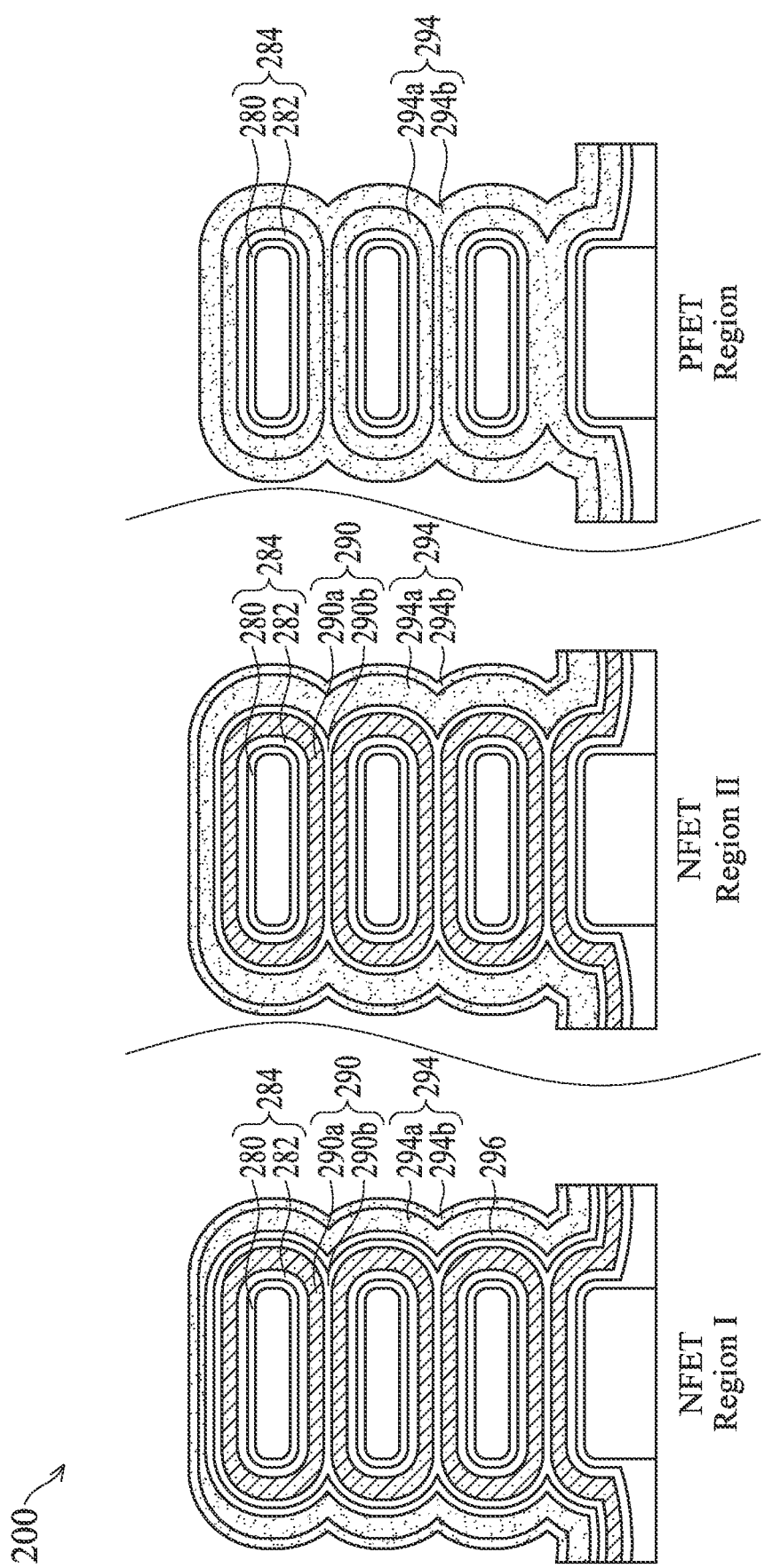
FIG. 17 is a fragmentary cross-sectional view of three stacks of channel layers in three respective regions of the semiconductor device in FIG. 2 in accordance with some embodiments of the present disclosure.

FIGS. 1A and 1B illustrate a flow chart of a method 100 for fabricating a semiconductor device 200 (or simply, device 200) according to various aspects of the present disclosure. In some embodiments, the method 100 fabricates a semiconductor device that includes GAA transistors. Additional processing is contemplated by the present disclosure. Additional steps can be provided before, during, and after the method 100, and some of the steps described below can be moved, replaced, or eliminated for additional embodiments of the method 100. The method 100 is described below in conjunction with FIGS. 2 through 17. FIG. 2 is a diagrammatic top view of the device 200, in portion, at a fabrication stage associated with method 100 according to various aspects of the present disclosure. FIGS. 3A-14B are diagrammatic cross-sectional views of the device 200, in portion, at various fabrication stage associated with method 100 according to various aspects of the present disclosure. Particularly, FIGS. 3A, 4A, 5A, 6A, 7A, 8A, 9A, 10A, 11A, 12A, 13A, and 14A illustrate corresponding cross-sectional views of the device 200 along the A-A line of FIG. 2. FIGS. 3B, 4B, 5B, 6B, 7B, 8B, 9B, 10B, 11B, 12B, 13B, and 14B illustrate corresponding cross-sectional views of the device 200 along the B-B line of FIG. 2. FIGS. 15A-illustrate various embodiments of a channel region of an NFET of the device 200. FIG. 16 is a bar chart illustrating effects of NFET Vt tuning associated with method 100 according to various aspects of the present disclosure. FIG. 17 is a diagrammatic cross-sectional view showing three channel regions of the device 200 according to various aspects of the present disclosure.

The device 200 is a multi-gate (or multigate) device in the present embodiments, and may be included in a microprocessor, a memory, and/or other IC devices. In some embodiments, the device 200 is a portion of an IC chip, a system on chip (SoC), or portion thereof, that includes various passive and active microelectronic devices such as resistors, capacitors, inductors, diodes, PFETs, NFETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 2-17 have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

Figure 3A:
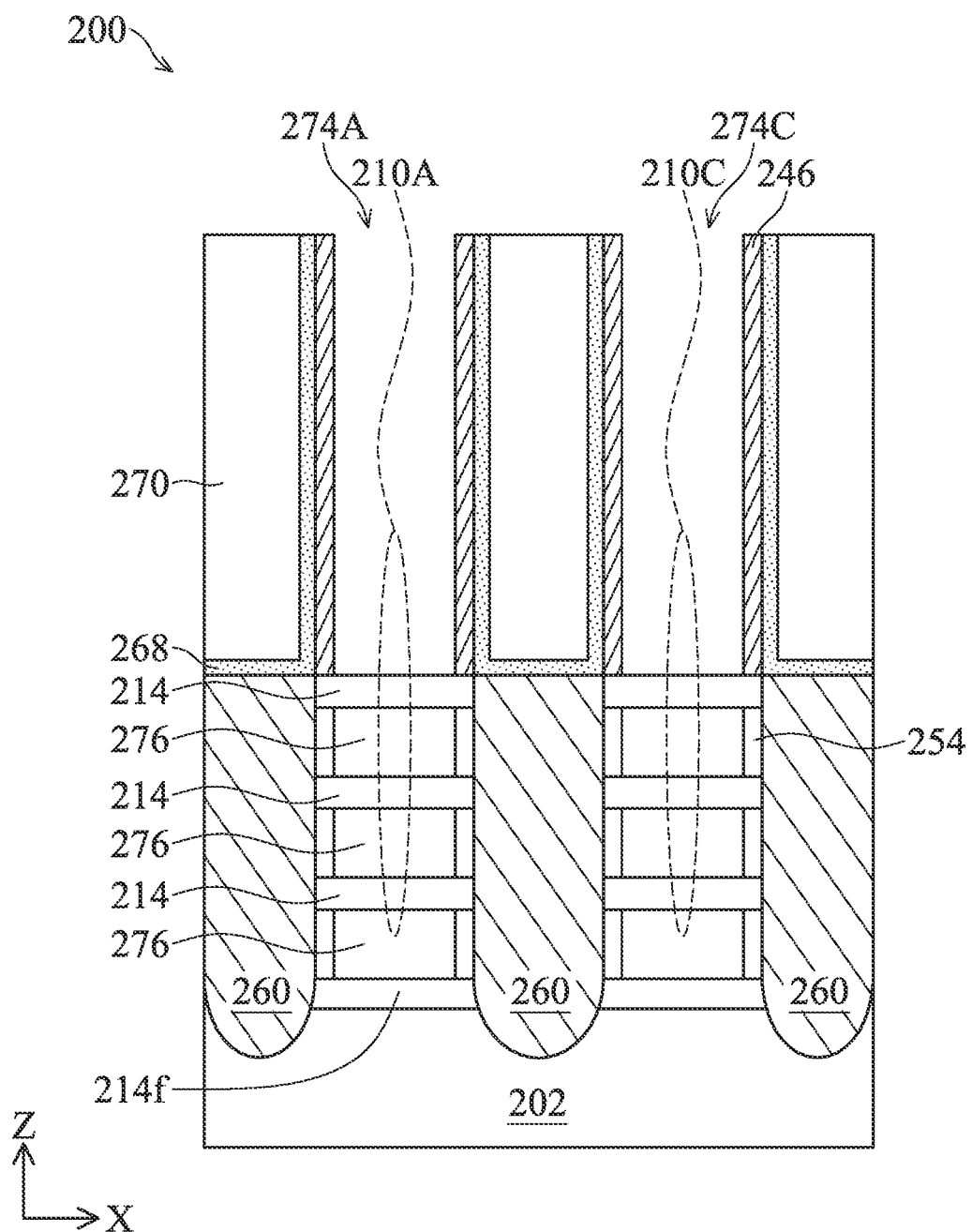
FIGS. 3A, 4A, 5A, 6A, 7A, 8A, 9A, 10A, 11A, 12A, 13A, and 14A are corresponding fragmentary cross-sectional views of the semiconductor device in FIG. 2 taken along a first cut A-A at intermediate stages of an embodiment of the method of FIGS. 1A and 1B in accordance with various aspects of the present disclosure.
Figure 3B:
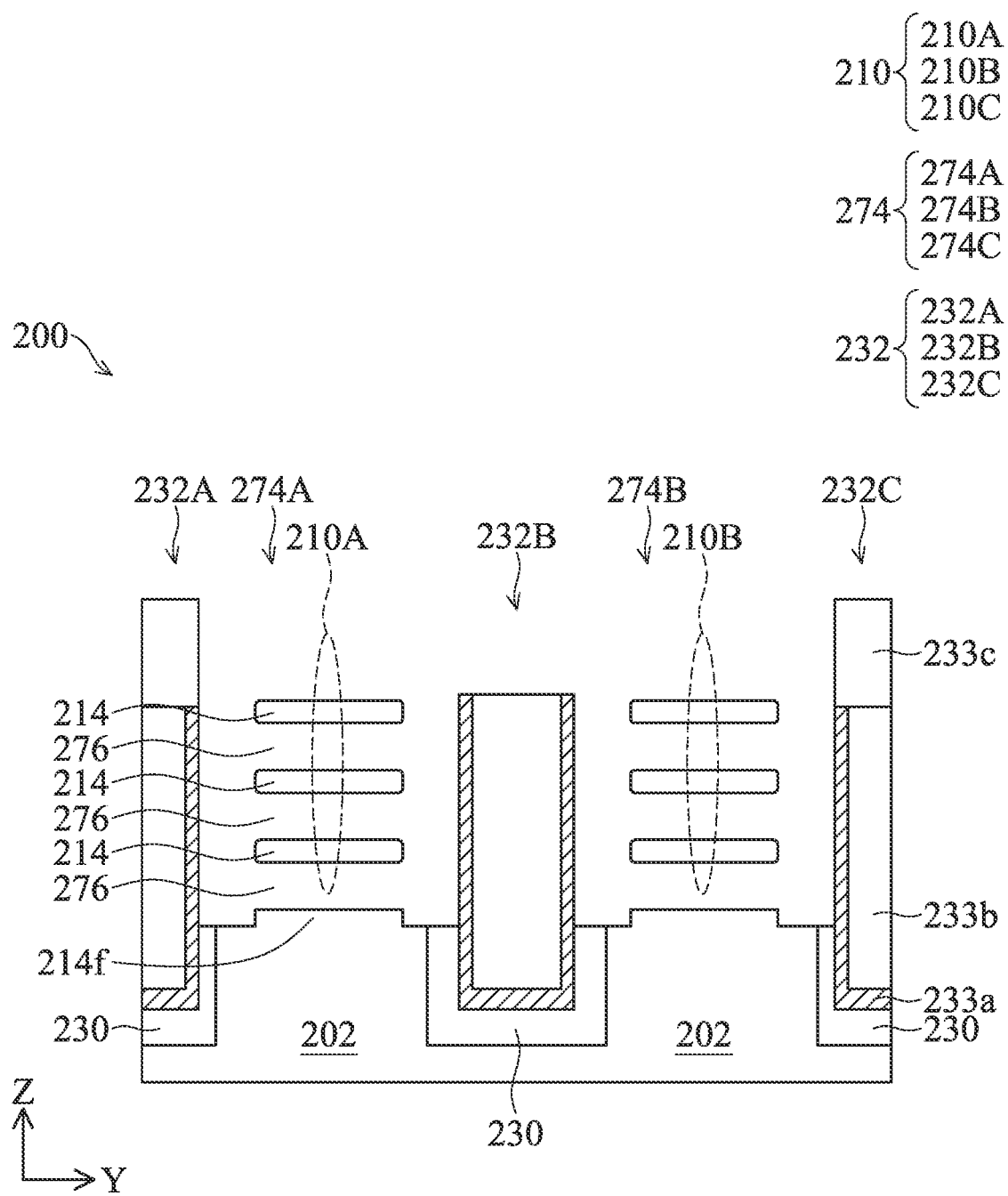
FIGS. 3B, 4B, 5B, 6B, 7B, 8B, 9B, 10B, 11B, 12B, 13B, and 14B are corresponding fragmentary cross-sectional views of the semiconductor device in FIG. 2 taken along a second cut B-B at intermediate stages of an embodiment of the method of FIGS. 1A and 1B in accordance with various aspects of the present disclosure.

At operation 102, the method 100 (FIG. 1A) provides or is provided with an initial structure of the device 200, a portion of which is shown in FIGS. 2 and 3A-3B according to an embodiment. Particularly, FIG. 2 illustrates that the device 200 includes active regions 204A and 204B (collectively, active regions 204) and gate regions 206A and 206B (collectively, gate regions 206) which are generally perpendicular to the active regions 204A and 204B, respectively. Each intersection of the active regions 204 and the gate regions 206 defines a channel region between a pair of S/D regions 208. For example, the active region 204A includes a first channel region 204A-1 between two S/D regions 208 and a second channel region 204A-2 between two S/D regions 208. Each gate region 206 engages the channel region of the respective active region 204 and is to form a transistor. For example, in the present embodiment, the gate region 206A engages the channel region 204A-1 of the active region 204A and is to form an NFET; the gate region 206B engages the channel region 204A-2 of the active region 204A and is to form a PFET; the gate region 206A engages the channel region 204B-1 of the active region 204B and is to form a PFET; and the gate region 206B engages the channel region 204B-2 of the active region 204B and is to form an NFET. The device 200 further includes dummy fins 232A-C (collectively, dummy fins 232) that are oriented lengthwise (along the "x" direction) generally parallel to the active regions and between the active regions. The dummy fins 232 may also be referred to as dielectric fins or hybrid fins.

FIG. 3A illustrates a cross-sectional view of the device 200 along the A-A line of FIG. 2 according to an embodiment. FIG. 3B illustrates a cross-sectional view of the device 200 along the B-B line of FIG. 2 according to an embodiment. The embodiments illustrated in FIGS. 3A-3B are nanosheet FETs, where their channel layers 214 are in the shape of nano-sized sheets. In some alternative embodiments, the channel layers 214 are in the shape of nano-sized wires or nano-sized rods. Due to the nano sizes, the channel layers 214 are also referred to as nano structures.

Referring to FIG. 3A, the device 200 includes a substrate (such as a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SW) substrate, a silicon germanium-on-insulator (SGOI) substrate, or a germanium-on-insulator (GM) substrate.

The device 200 further includes epitaxial source/drain (S/D) features 260, each epitaxial S/D feature being located in an S/D region 208 (FIG. 2). For NFETs, the epitaxial S/D features 260 may be of n-type doped. For PFETs, the epitaxial S/D features 260 may be of p-type doped. The epitaxial S/D features 260 may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. The epitaxial S/D features 260 are doped with proper n-type dopants and/or p-type dopants. For example, for NFETs, the epitaxial S/D features 260 may include silicon and be doped with carbon, phosphorous, arsenic, other n-type dopant, or combinations thereof; and for PFETs, the epitaxial S/D features 260 may include silicon germanium or germanium and be doped with boron, other p-type dopant, or combinations thereof.

Referring to FIGS. 3A-B, the device 200 further includes semiconductor fin base 214f protruding from the upper surface of the substrate 202, and stacks of semiconductor layers 214 suspended over the semiconductor fin base 214f. The semiconductor fin base 214f and the stacks of semiconductor layers 214 are in the channel regions of the active regions 204A-B and connecting respective pair of the epitaxial S/D features 260. Particularly, the depicted embodiment illustrates three stacks 210A, 210B, and 210C of semiconductor layers 214 that are located in the channel regions 204A-1, 204B-1, and 204A-2 (FIG. 2), respectively. The stack of semiconductor layers 214 serve as the transistor channels for the respective GAA transistors. Accordingly, the semiconductor layers 214 are also referred to as channel layers 214.

In the depicted embodiment, each of the stacks 210A, 210B, and 210C includes three channel layers 214. In an alternative embodiment, each of the stacks 210A, 210B, and 210C may include more than three channel layers 214, such as up to 10 channel layers 214. The channel layers 214 are exposed in respective gate trenches 274A-C (collectively, gate trenches 274) which are resulted from the removal of a dummy gate from the respective gate regions 206A-B therein. The channel layers 214 may include single crystalline silicon. Alternatively, the channel layers 214 may include germanium, silicon germanium, or another suitable semiconductor material(s). Initially, the channel layers 214 are formed as part of a semiconductor layer stack that includes the channel layers 214 and other semiconductor layers of a different material. The semiconductor layer stack is patterned into a shape of a fin protruding above the substrate 202 using one or more photolithography processes, including double-patterning or multi-patterning processes. After the gate trenches 274 are formed, the semiconductor layer stack is selectively etched to remove the other semiconductor layers, leaving the channel layers 214 suspended over the semiconductor fin base 214f and connecting the respective epitaxial S/D features 260. The channel layers 214 are separated from each other and from the semiconductor fin base 214f by vertical spacing (or referred to as gaps) 276. In the depicted embodiment, the channel layers 214 in the stack 210A provide channels of a to-be-formed NFET, the channel layers 214 in the stack 210B provide channels of a to-be-formed PFET, and the channel layers 214 in the stack 210C provide channels of another to-be-formed PFET.

In some embodiments, each channel layer 214 has nanometer-sized dimensions, thus may be referred to as nanostructures. For example, each channel layer 214 may have a length (along the "x" direction) about 10 nm to about 300 nm, and a width (along the "y" direction) about 10 nm to about 50 nm, and a height or thickness (along the "z" direction) about 4 nm to about 8 nm in some embodiments. The vertical spacing (gaps) 276 (along the "z" direction) between the channel layers 214 may be about 7 nm to about 20 nm in some embodiments. Thus, the channel layer 214 can be referred to as a "nanowire" or "nanosheet" which generally refers to a channel layer suspended in a manner that will allow a high-k metal gate to physically wrap around the channel layer. In some embodiments, the channel layers 214 may be cylindrical-shaped (e.g., nanowire), rectangular-shaped (e.g., nanobar), sheet-shaped (e.g., nanosheet), or have other suitable shapes.

Referring to FIG. 3B, the device 200 further includes an isolation structure 230 to isolate various regions, such as the various active regions 204A-C. The isolation structure 230 includes silicon oxide, silicon nitride, silicon oxynitride, other suitable isolation material (for example, including silicon, oxygen, nitrogen, carbon, or other suitable isolation constituent), or combinations thereof. The isolation structure 230 can include different structures, such as shallow trench isolation (STI) structures, deep trench isolation (DTI) structures, and/or local oxidation of silicon (LOCOS) structures. The isolation structure 230 can include multiple layers of insulating materials.

Referring to FIG. 3A, the device 200 further includes gate spacers 246 adjacent to the epitaxial S/D features 260. The gate spacers 246 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 246 include a multilayer structure, such as a first dielectric layer that includes silicon nitride and a second dielectric layer that includes silicon oxide. The device 200 further includes inner spacers 254 vertically between adjacent channel layers 214 and adjacent to the epitaxial S/D features 260. The inner spacers 254 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacers 254 include a low-k dielectric material. The gate spacers 246 and the inner spacers 254 are formed by deposition (e.g., CVD, PVD, ALD, etc.) and etching processes (e.g., dry etching). The gate trenches 274 are provided between opposing gate spacers 246 and opposing inner spacers 254 along the "x" direction.

The device 200 further includes a contact etch stop layer (CESL) 268 disposed over the isolation structure 230, the epitaxial S/D features 260, and the gate spacers 246. The CESL 268 includes silicon and nitrogen, such as silicon nitride or silicon oxynitride. The CESL 268 may be formed by a deposition process, such as CVD, or other suitable methods. The device 200 further includes an inter-level dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

Referring to FIG. 3B, the dummy fins 232 are disposed over the isolation structure 230. In the embodiment depicted in FIG. 3B, the dummy fins 232A and 232C include a dielectric liner layer 233a, a dielectric fill layer 233b over the dielectric liner layer 233a, and a dielectric helmet 233c over the dielectric layers 233a and 233b. Notably, the dielectric helmet 233c is deposited but subsequently removed from the dummy fin 232B, such that top surfaces of the dielectric layers 233a and 233b of the dummy fin 232B are exposed. The removal of the dielectric helmet 233c from the dummy fin 232B may include a lithography process and a selective etching process, such as a selective wet etch, a selective dry etch, or a combination thereof. The recessed dummy fin 232B allows a joint gate structure (e.g., a joint HKMG) to from in both the gate trenches 274A and 274B and straddle the recessed dummy fin 232B, while the heightened dummy fins 232A and 232C function as gate cut features, isolating the joint gate structure from adjacent other gate structures.

In an embodiment, the dielectric liner layer 233a includes a low-k dielectric material such as a dielectric material including Si, O, N, and C. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, lower than that of silicon oxide (k≈3.9). The dielectric liner layer 233a may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233b includes silicon oxide, silicon nitride, silicon oxynitride, TEOS formed oxide, PSG, BPSG, low-k dielectric material, other suitable dielectric material, or combinations thereof. The dielectric fill layer 233b may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233b may be deposited using other types of methods. In an embodiment, the dielectric helmet 233c includes a high-k dielectric material, such as HfO2, HfSiO, HfSiO$_4$, HfSiON, HfLaO, HfTaO, HfTiO, HfZrO, HfAlOx, ZrO, ZrO$_2$, ZrSiO$_2$, AlO, AlSiO, Al$_2$O$_3$, TiO, TiO$_2$, LaO, LaSiO, Ta$_2$O$_3$, Ta$_2$O$_5$, Y$_2$O$_3$, SrTiO$_3$, BaZrO, BaTiO$_3$ (BTO), (Ba,Sr)TiO$_3$ (BST), Si$_3$N$_4$, hafnium dioxide-alumina (HfO$_2$—Al$_2$O$_3$) alloy, other suitable high-k dielectric material, or combinations thereof. High-k dielectric material generally refers to dielectric materials having a high dielectric constant, for example, greater than that of silicon oxide (k≈3.9). The dielectric helmet 233c is formed by any of the processes described herein, such as ALD, CVD, PVD, oxidation-based deposition process, other suitable process, or combinations thereof. The gate trenches 274 are provided between opposing dummy fins 232 along the "y" direction.

Figure 4A:
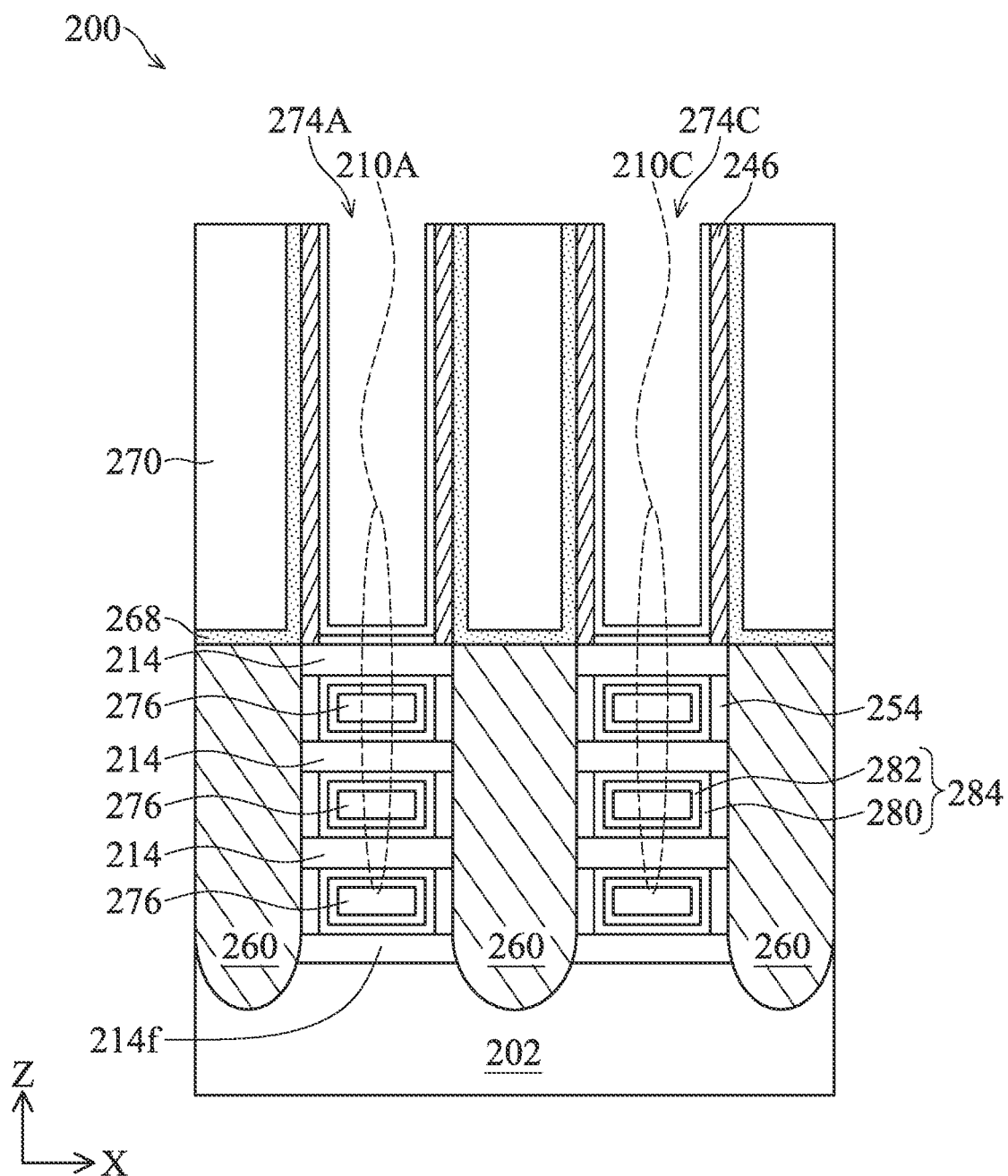
Figure 4B:
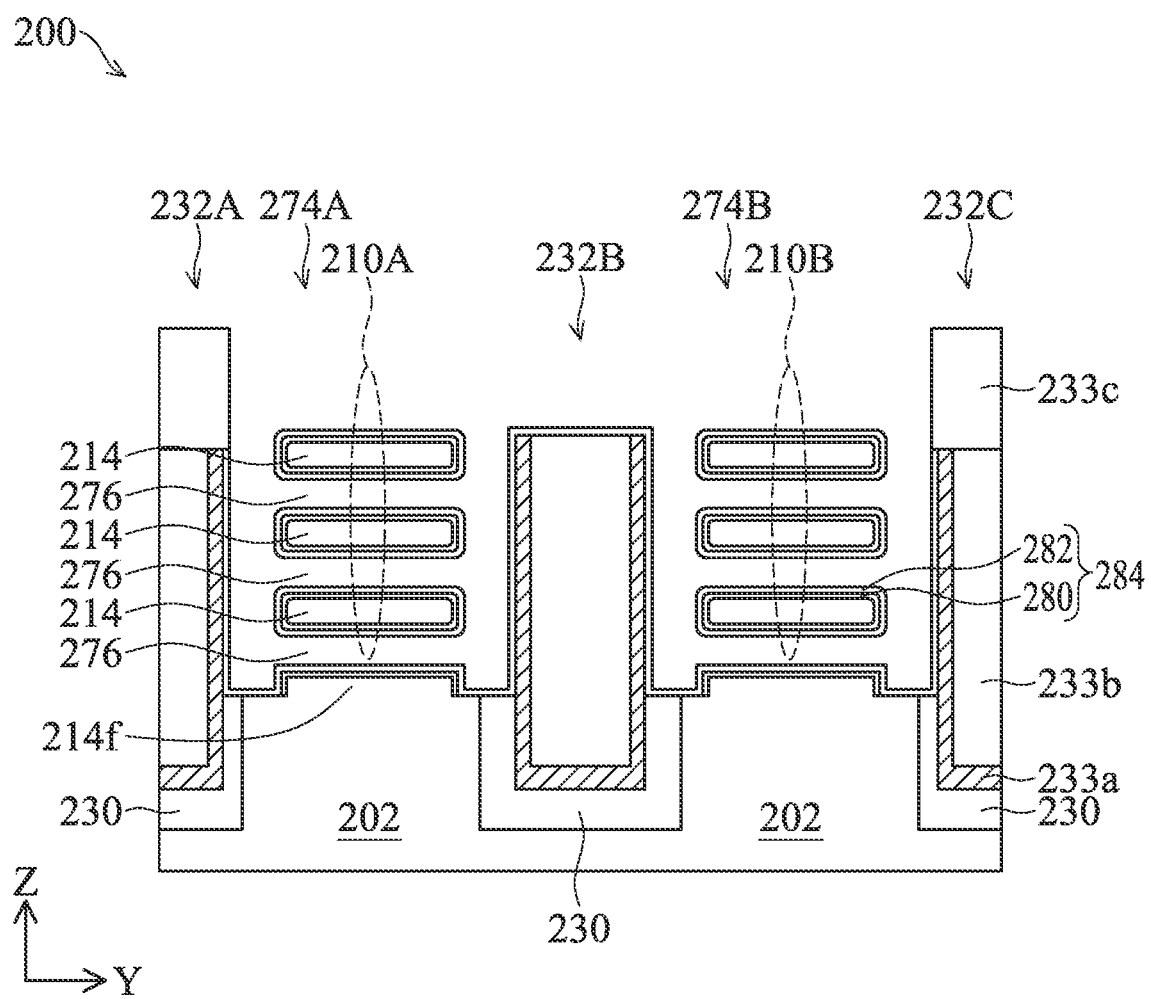

At the operation 104, the method 100 (FIG. 1A) forms an interfacial gate dielectric layer (or simply, interfacial layer) 280 on the surfaces of the channel layers 214 that are exposed in the gate trenches 274 and a high-k gate dielectric layer (or simply, high-k dielectric layer) 282 over the interfacial layer 280 and over other structures exposed in the gate trenches 274, such as shown in FIGS. 4A-B. The interfacial layer 280 and the high-k dielectric layer 282 may be collectively referred to as a gate dielectric layer 284. The interfacial layer 280 wraps around each of the channel layers 214 and partially fills the gaps 276. In the present embodiment, the interfacial layer 280 is disposed on the semiconductor surfaces exposed in the gate trenches 274 such as the surfaces of the channel layers 214 and the semiconductor fin base 214f, but not on the dielectric surfaces exposed in the gate trenches 274 such as the surfaces of the isolation structure 230, the gate spacers 246, and the dummy fins 232. For example, the interfacial layer 280 may be formed by an oxidation process (such as thermal oxidation or chemical oxidation) where the semiconductor surfaces react with oxygen to form a semiconductor oxide as the interfacial layer 280. In such oxidation process, the dielectric surfaces do not react with the oxygen, thus, the interfacial layer 280 is not formed thereon. In an alternative embodiment, the interfacial layer 280 is disposed not only on the channel layers 214 and the semiconductor fin base 214f, but also on the isolation structure 230, the gate spacers 246, and the dummy fins 232, for example, by using atomic layer deposition (ALD) or other suitable deposition methods. The interfacial layer 280 includes a dielectric material, such as SiO$_2$, HfSiO, SiON, other silicon-containing dielectric material, other suitable dielectric material, or combinations thereof. In some embodiments, the interfacial layer 280 has a thickness of about 5 Å to about 15 Å.

Still referring to FIGS. 4A-B, the high-k dielectric layer 282 is disposed over the interfacial layer 280 and wraps around each of the channel layers 214. The high-k dielectric layer 282 and the interfacial layer 280 collectively partially fill the gaps 276. In the depicted embodiment, the high-k dielectric layer 282 is also disposed on the isolation structure 230, the gate spacers 246, and the dummy fins 232. The high-k dielectric layer 282 includes a high-k dielectric material, such as HfO$_2$, HfSiO, HfSiO$_4$, HfSiON, HfLaO, HfTaO, HfSiO, HfZrO, HfAlOx, ZrO, ZrO$_2$, ZrSiO$_2$, AlO, AlSiO, Al$_2$O$_3$, TiO, TiO$_2$, LaO, LaSiO, Ta$_2$O$_3$, Ta$_2$O$_5$, Y$_2$O$_3$, SrTiO$_3$, BaZrO, BaTiO$_3$ (BTO), (Ba,Sr)TiO$_3$ (BST), hafnium dioxide-alumina (HfO$_2$—Al$_2$O$_3$) alloy, other suitable high-k dielectric material, or combinations thereof. The high-k dielectric layer 282 is formed by any of the processes described herein, such as ALD, CVD, PVD, oxidation-based deposition process, other suitable process, or combinations thereof. In some embodiments, the high-k dielectric layer 282 has a thickness of about 1 nm to about 2 nm.

Figure 5A:
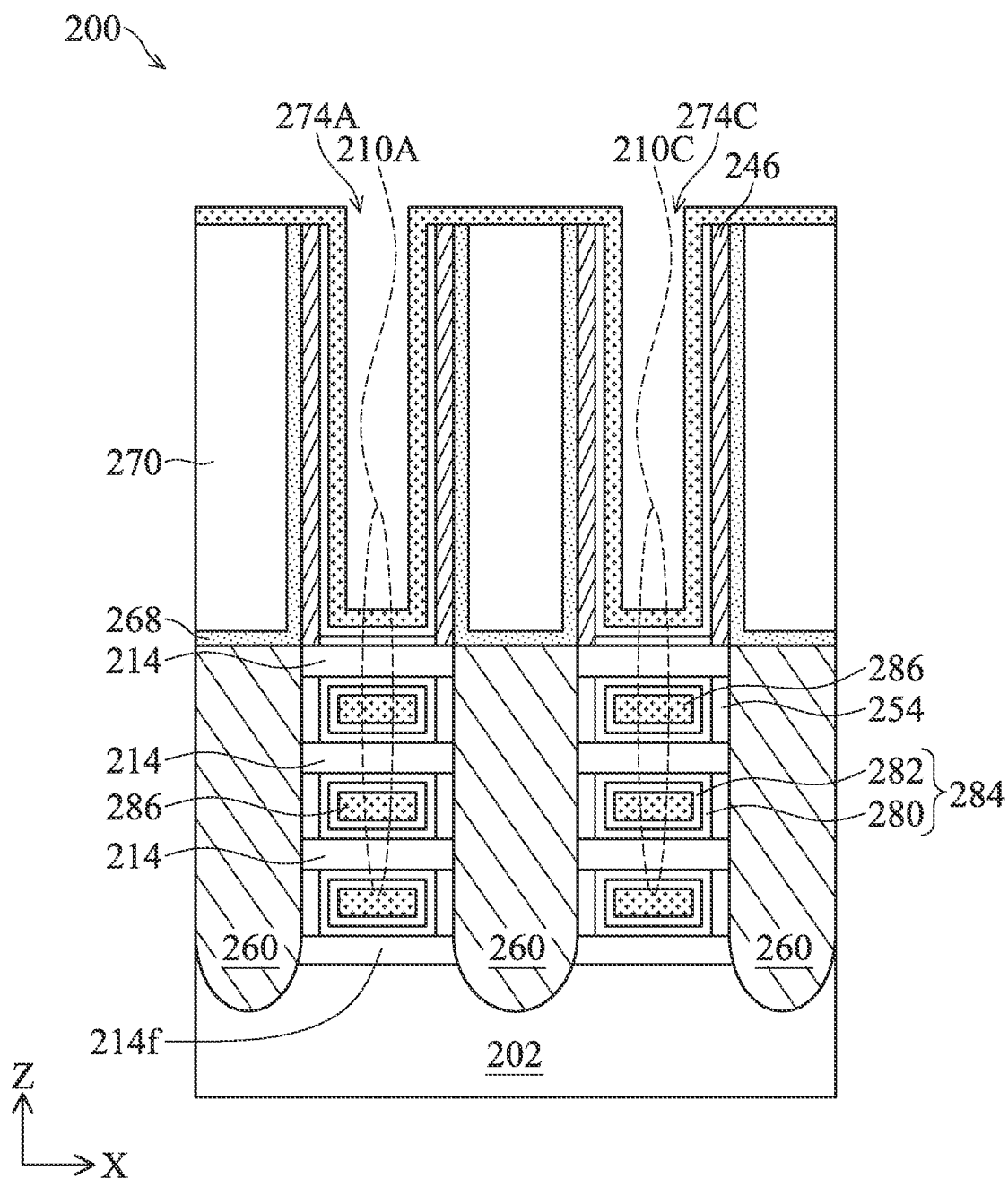
Figure 5B:
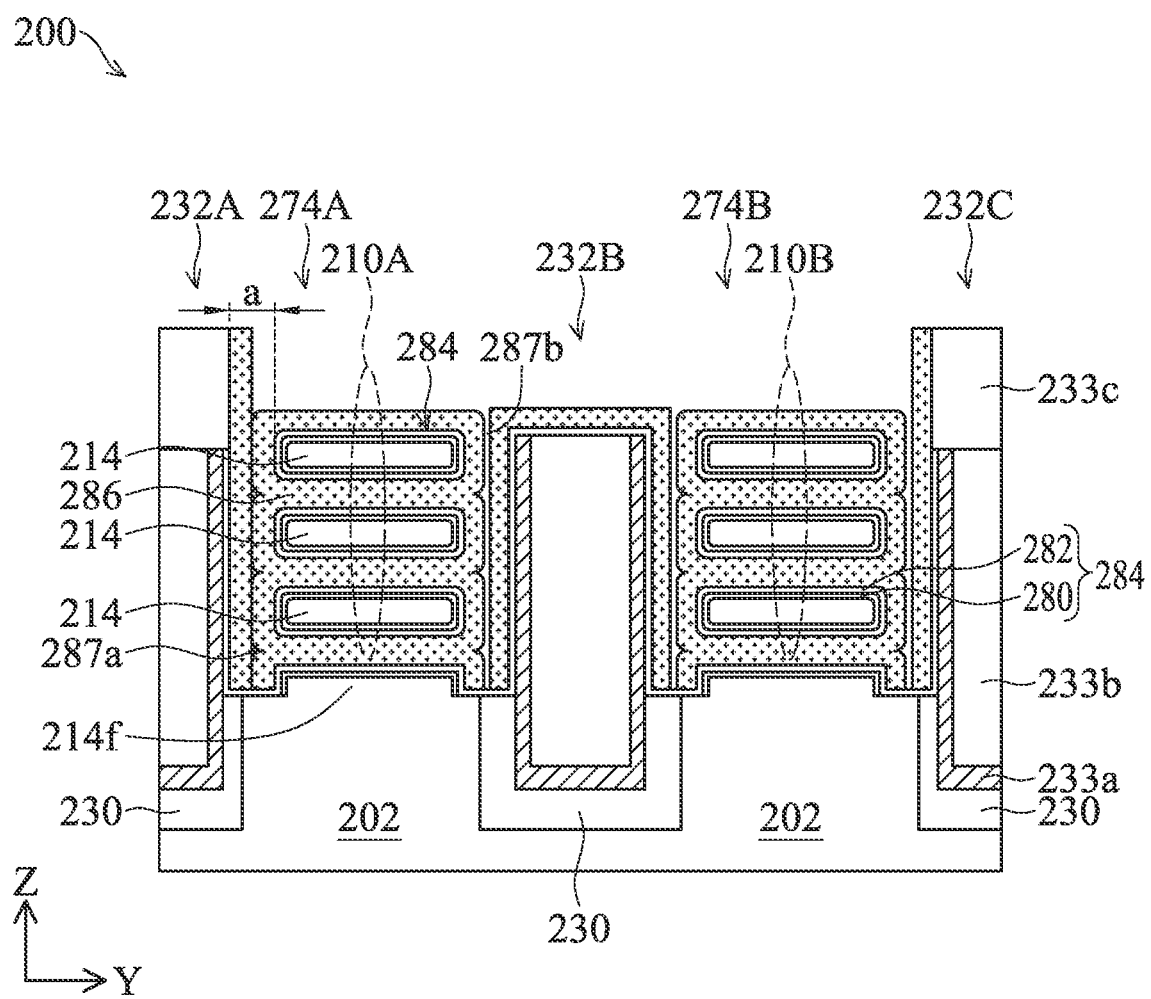
Figure 6A:
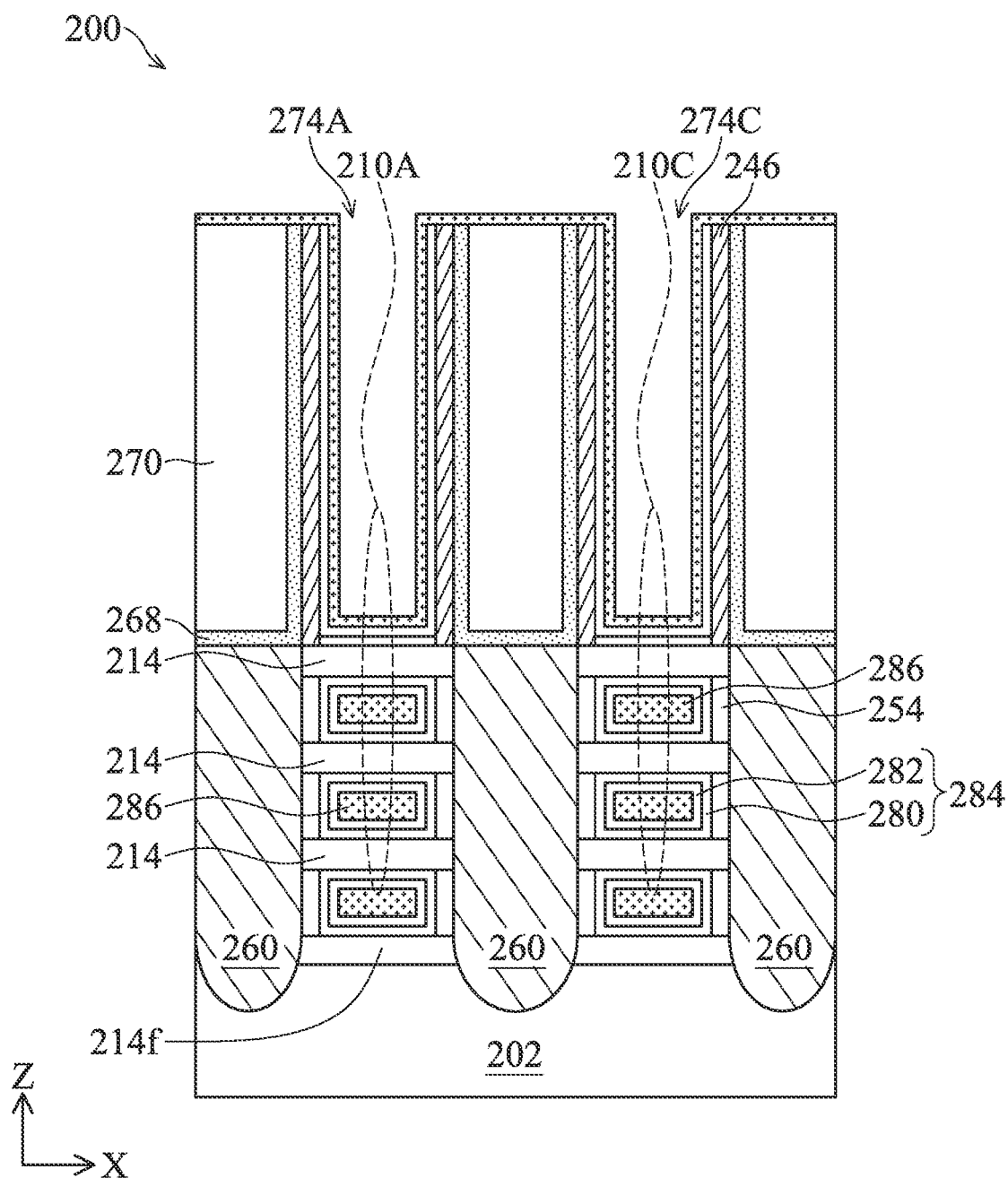
Figure 6B:
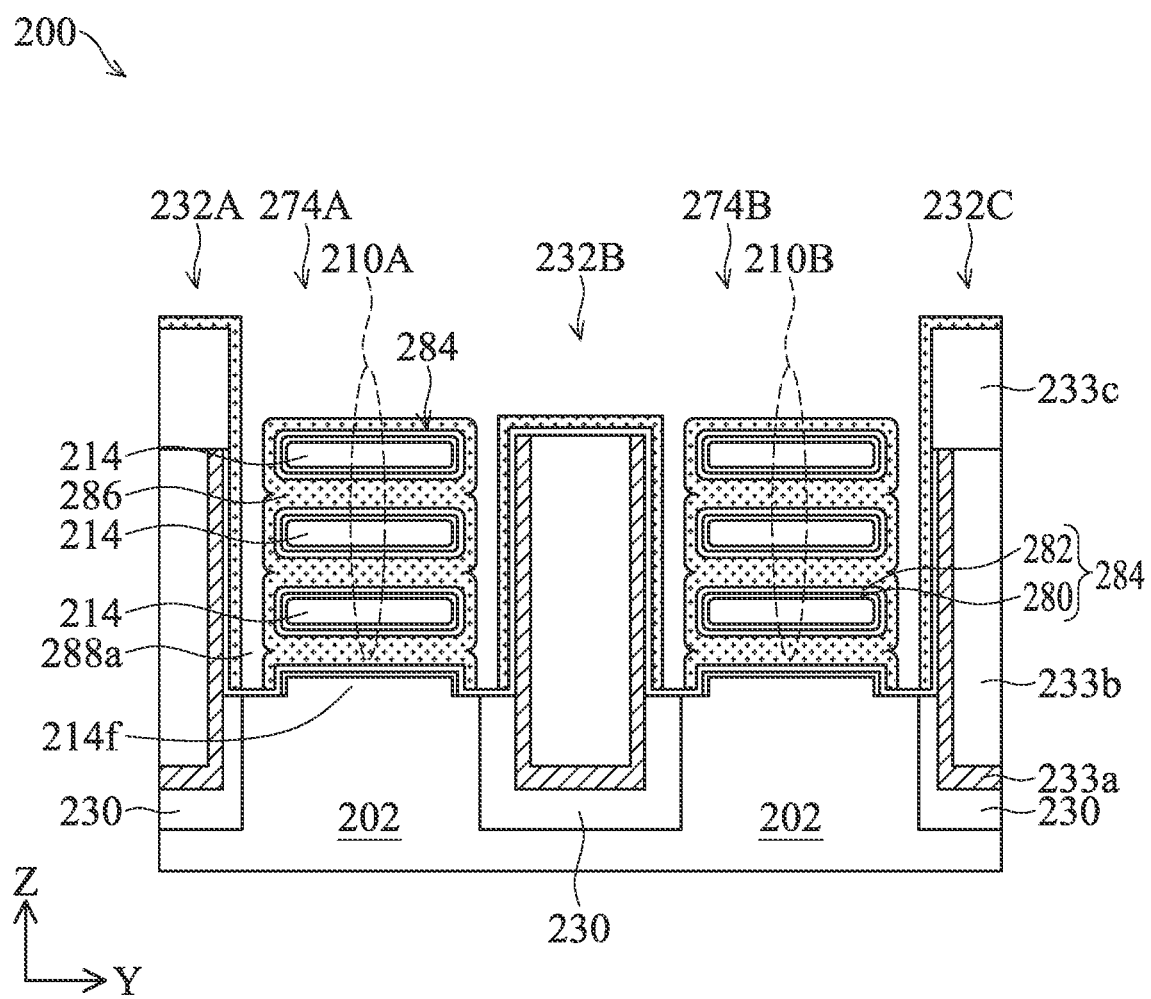

At operation 106, the method 100 (FIG. 1A) deposits a dielectric layer 286 in the gate trenches 274 and over the stacks 210A-C such as shown in FIGS. 5A-B according to an embodiment. Referring to FIGS. 5A-B, the dielectric layer 286 is deposited over the dummy fins 232 and also deposited on the surfaces of the high-k dielectric layer 282, such that the dielectric layer 286 wraps around the channel layers 214 and fully fills the gaps 276. As the dimensions of the device 200 decrease, various sacrificial features introduced during the fabrication processes, such as resist material, hard mask material, metal materials, may remain in the gaps 276 and become difficult to remove, which may deteriorate device performance. The dielectric layer 286 fully fills the gaps 276 and reserves the gaps 276. Therefore, material and deposition method for forming the dielectric layer 286 is not arbitrarily picked, but to exhibit high etch selectivity and strong gap filling capability. In an embodiment, the dielectric layer 286 includes a metal oxide such as alumina ($Al_2O_3$) and is deposited using a CVD method, such as plasma enhanced chemical vapor deposition (PECVD) process. In various embodiments, the dielectric layer 286 may include silicon nitride, lanthanum oxide, silicon (such as polysilicon), silicon carbonitride, silicon oxy carbonitride, aluminum nitride, aluminum oxynitride, a combination thereof, or other suitable materials. In some embodiments, the dielectric layer 286 may be deposited using ALD, CVD, a thermal process (such as a furnace process), a PVD process, or other suitable processes, and may be deposited at a temperate in a range of about 100° C. to about 400° C. and pressure in a range of about 1 torr to 100 torr. A thickness of the dielectric layer 286 may range from about 2 nm to about 10 nm in some embodiments. In the present embodiment, the distance a (along the "y" direction) between the sidewalls of the dummy fins 232 and the high-k dielectric layer 282 is about a merge-critical-dimension (or merge-CD) of the dielectric material of the dielectric layer 286, such as from about 5 nm to about 15 nm in some examples. In other words, when the dielectric material of the dielectric layer 286 is deposited (for example, using CVD) over the high-k dielectric layer 282, the distance a is so small that the dielectric material disposed over the sidewalls of the dummy fins 232 and the dielectric material disposed over the stacks 210A-C of channel layers may merge, leaving voids 287a, or almost merge, leaving seams 287b in the gate trenches 274.

At operation 108, the method 100 (FIG. 1A) performs a thinning process to partially remove the dielectric layer 286 from the gate trench 274, such that available space in the gate trench 274 is expanded. The thinning process may include dry etching, wet etching, reactive ion etching (RIE), and/or other suitable processes. In some embodiments, the dielectric layer 286 is etched by ammonium hydroxide ($NH_4OH$), tetramethylammonium hydroxide (TMAH), ethylenediamine pyrocatechol (EDP), or potassium hydroxide (KOH) solutions. In the depicted embodiment, remaining portions of the dielectric layer 286 still cover sidewalls of the dielectric fins 232 and surfaces of the high-k dielectric layer 282, but with a reduced thickness. In one example, the thinning process includes a wet etching process with etchant of $NH_4OH:H_2O_2$ in a ratio ranging from about 1:10 to 1:30 for a duration of 30 seconds to about 50 seconds, and the dielectric layer 286 is thinned for about 1 nm to about 3 nm. In the depicted embodiment, a horizontal portion of the high-k dielectric layer 282 deposited in the bottom surface of the gate trenches 274 is exposed after the thinning process. In various examples, the gaps 276 remain filled by the dielectric layer 286 after the thinning process. Without the thinning process, the gate trenches 274 may not have enough space larger than a critical dimension to allow subsequent deposition processes.

Figure 7A:
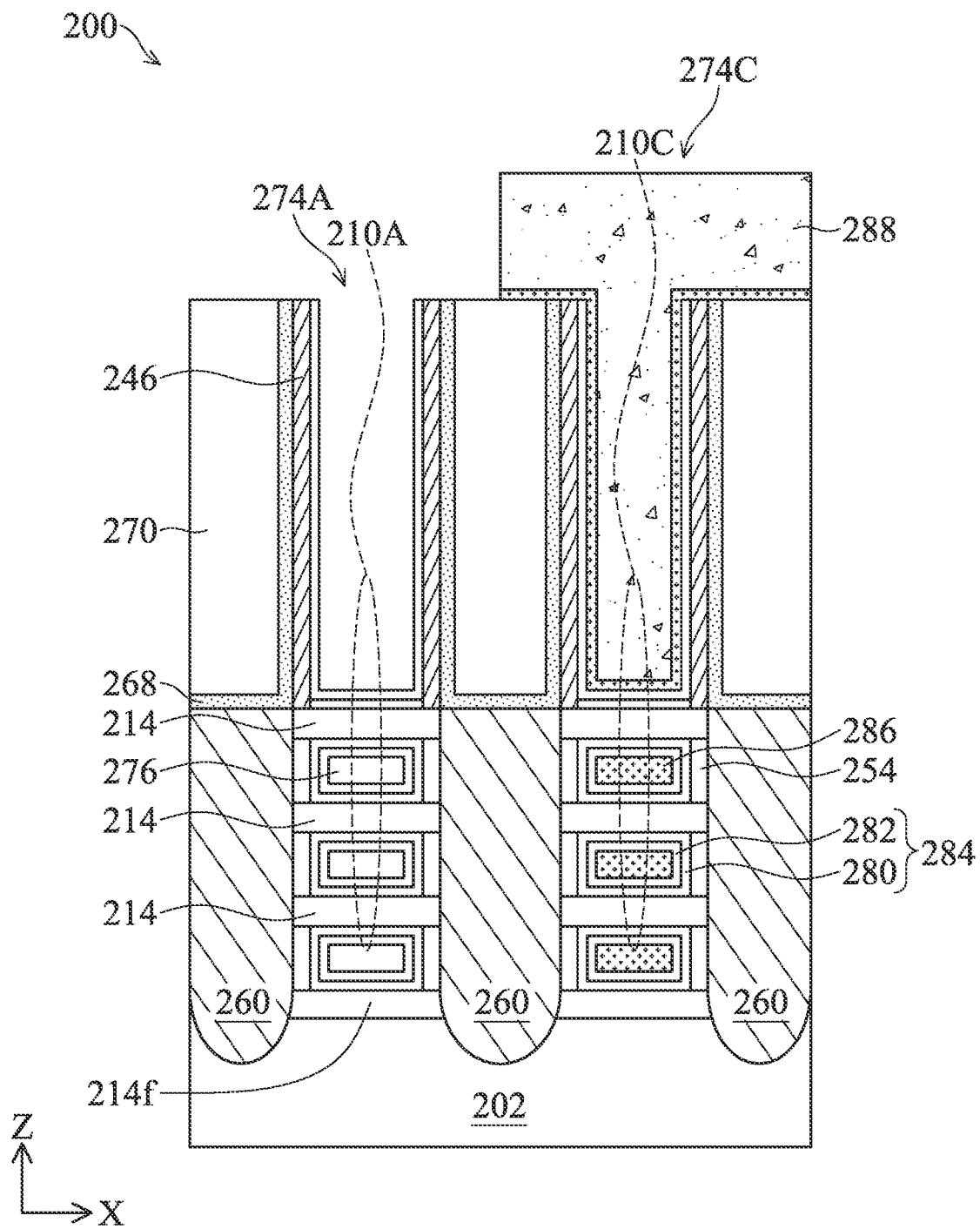
Figure 7B:
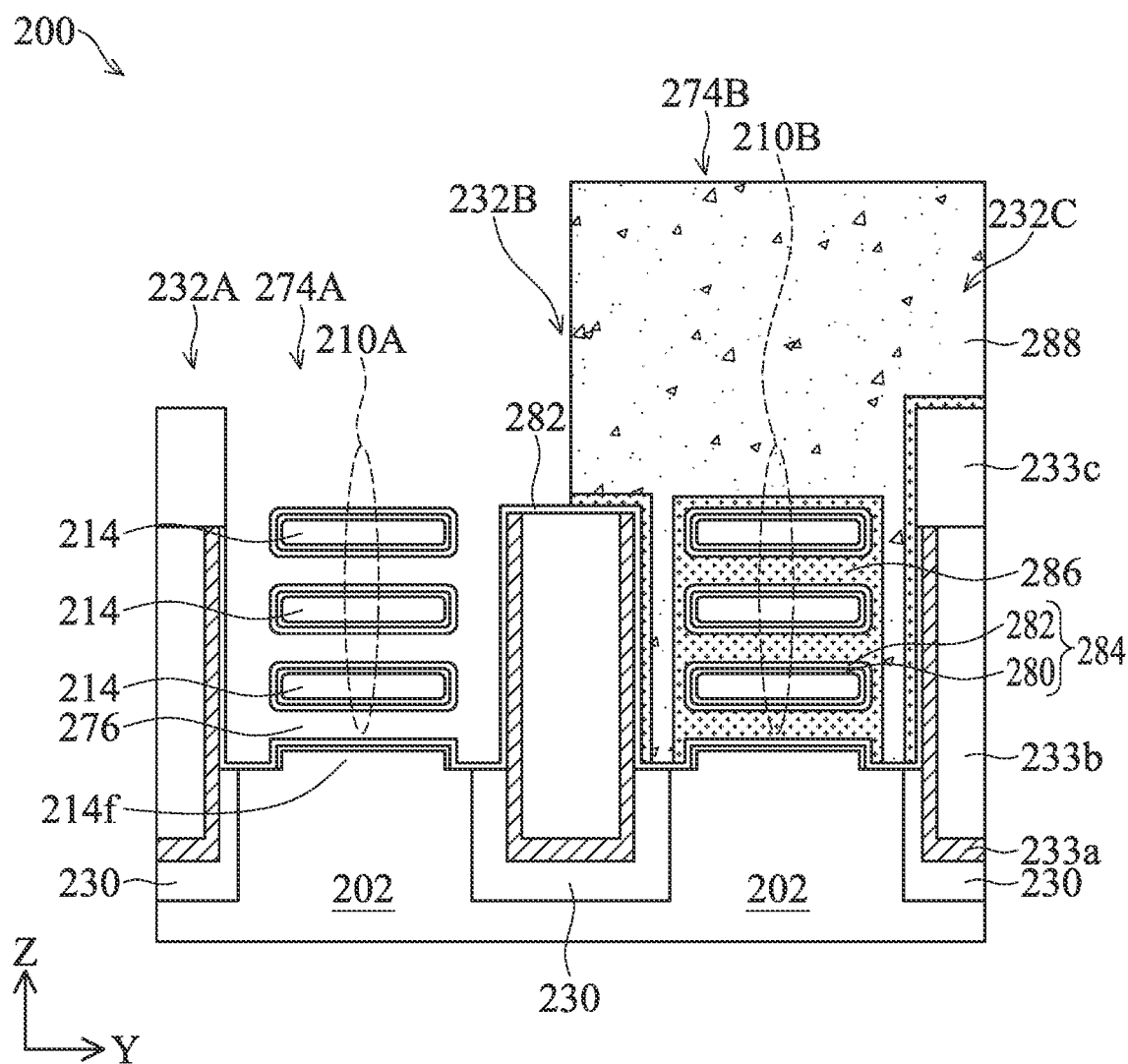

At operation 110, the method 100 (FIG. 1A) removes the dielectric layer 286 from regions where NFETs are to be formed (also referred to as NFET regions), such as shown in FIGS. 7A-B according to an embodiment. A patterned etch mask layer 288 is formed over the device 200, particularly over regions where PFETs are to be formed (also referred to as PFET regions), including the gate trenches 274B-C. For example, the etch mask layer 288 may include a bottom anti-reflective coating (BARC) material that provides a platform for photoresist coating and photoresist patterning, as well as provides etch selectivity with respect to the dielectric layer 286. In an embodiment, the etch mask layer 288 is formed by spin coating a BARC material over the dielectric layer 286 and baking the BARC material (for example, at a temperature in a range about 100° C. to about 200° C.) to cause cross-linking within the BARC material. Subsequently, the etch mask layer 288 is patterned to form openings exposing the gate trench 274A and the stack 210A therein, while rest of the etch mask layer 288 still covers the stacks 210B-C. In an embodiment, the patterning of the etch mask layer 288 includes a lithography process that forms a resist (or photoresist) layer over the etch mask layer 288 by spin coating, performs a pre-exposure baking process, performs an exposure process, perform a post-exposure baking process, and develops the exposed resist layer in a developer solution. After the development, the resist layer becomes a resist pattern that corresponds with the photomask. The exposure process can be implemented using a photomask or using a maskless lithography process such as e-beam writing, ion-beam writing, or combinations thereof. Using the resist pattern as an etch mask, the operation 110 etches the etch mask layer 288 (for example, using an anisotropic etching process) to form the openings over the NFET regions. Then, the dielectric layer 286 is etched through the openings. As depicted, the dielectric layer 286 is removed from the stack 210A and from the dummy fin 232A and partially from top surfaces of the dummy fin 232B that are exposed in the openings, thereby exposing the gaps 276 between the channel layers 214. The high-k dielectric layer 282 in the gate trench 274A are exposed again. The etching process provides a high etching selectivity with respect to the dielectric layer 286 relative to the high-k dielectric layer 282. The etching process may implement wet etching, dry etching, or a combination thereof. In some embodiments, the dielectric layer 286 is etched by ammonium hydroxide ($NH_4OH$), tetramethylammonium hydroxide (TMAH), ethylenediamine pyrocatechol (EDP), or potassium hydroxide (KOH) solutions. In one example, the thinning process includes a wet etching process with etchant of $NH_4OH:H_2O_2$ in a ratio ranging from about 1:10 to 1:30 for a duration of 150 seconds to about 400 seconds. After the dielectric layer 286 is etched, operation 110 removes the patterned etch mask layer 288 from the PFET regions, for example, using stripping or ashing.

Figure 8A:
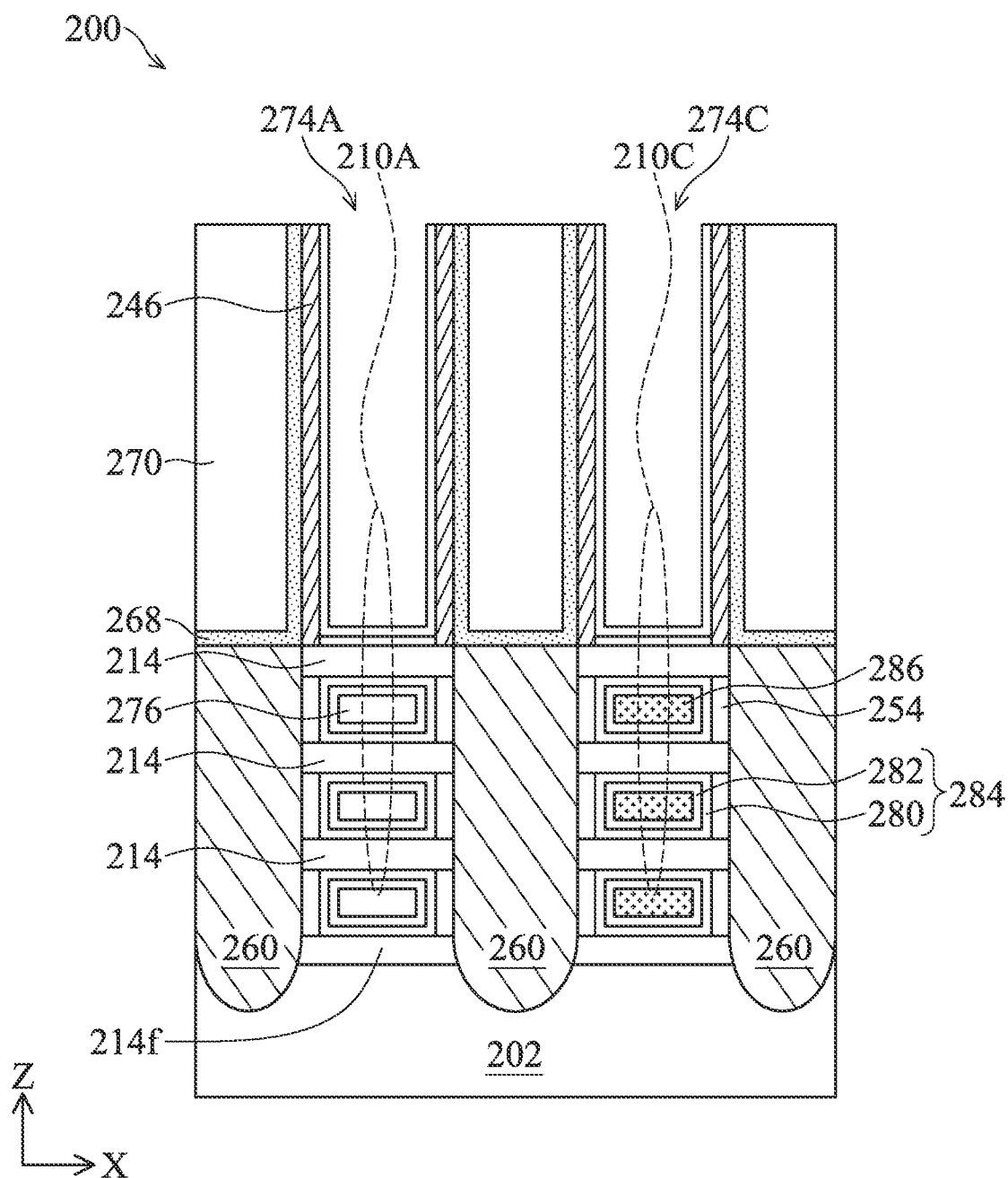
Figure 8B:
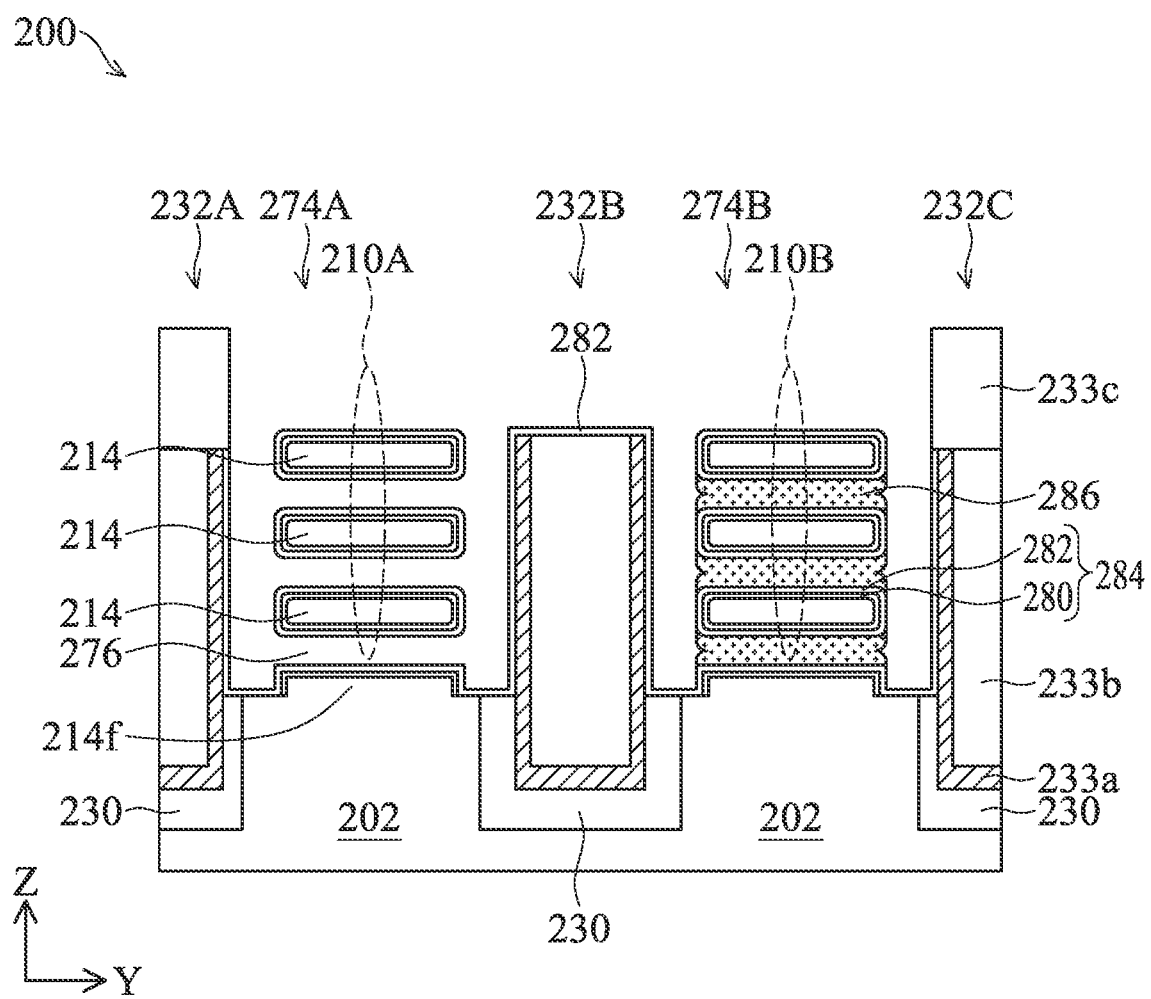

At operation 112, the method 100 (FIG. 1A) partially removes the dielectric layer 286 from PFET regions, such as shown in FIGS. 8A-B according to an embodiment. In the depicted embodiment, inside the gate trenches 274B-C, the dielectric layer 286 still fills the gaps 276, while high-k dielectric layer 282 on sidewalls and top surface of the stacks 210B-C and on sidewalls of the dummy fins 232B-C are exposed. The partial removal of the dielectric layer 286 may include dry etching, wet etching, reactive ion etching (RIE), and/or other suitable processes. In some embodiments, the dielectric layer 286 is etched by ammonium hydroxide ($NH_4OH$), tetramethylammonium hydroxide (TMAH), ethylenediamine pyrocatechol (EDP), or potassium hydroxide (KOH) solutions. In one example, the thinning process includes a wet etching process with etchant of $NH_4OH:H_2O_2$ in a ratio ranging from about 1:10 to 1:30 for a duration of 50 seconds to about 100 seconds.

Figure 9A:
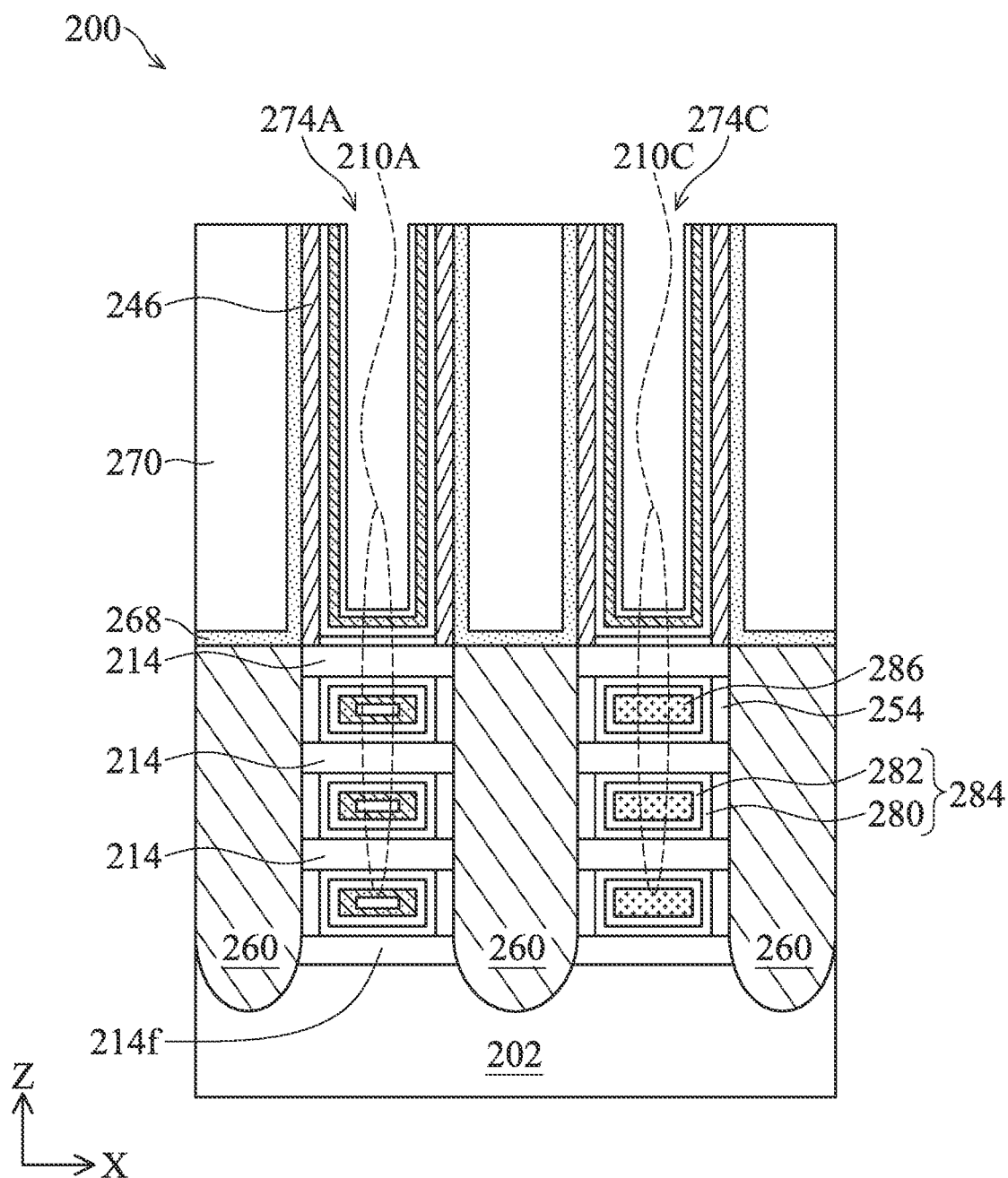
Figure 9B:
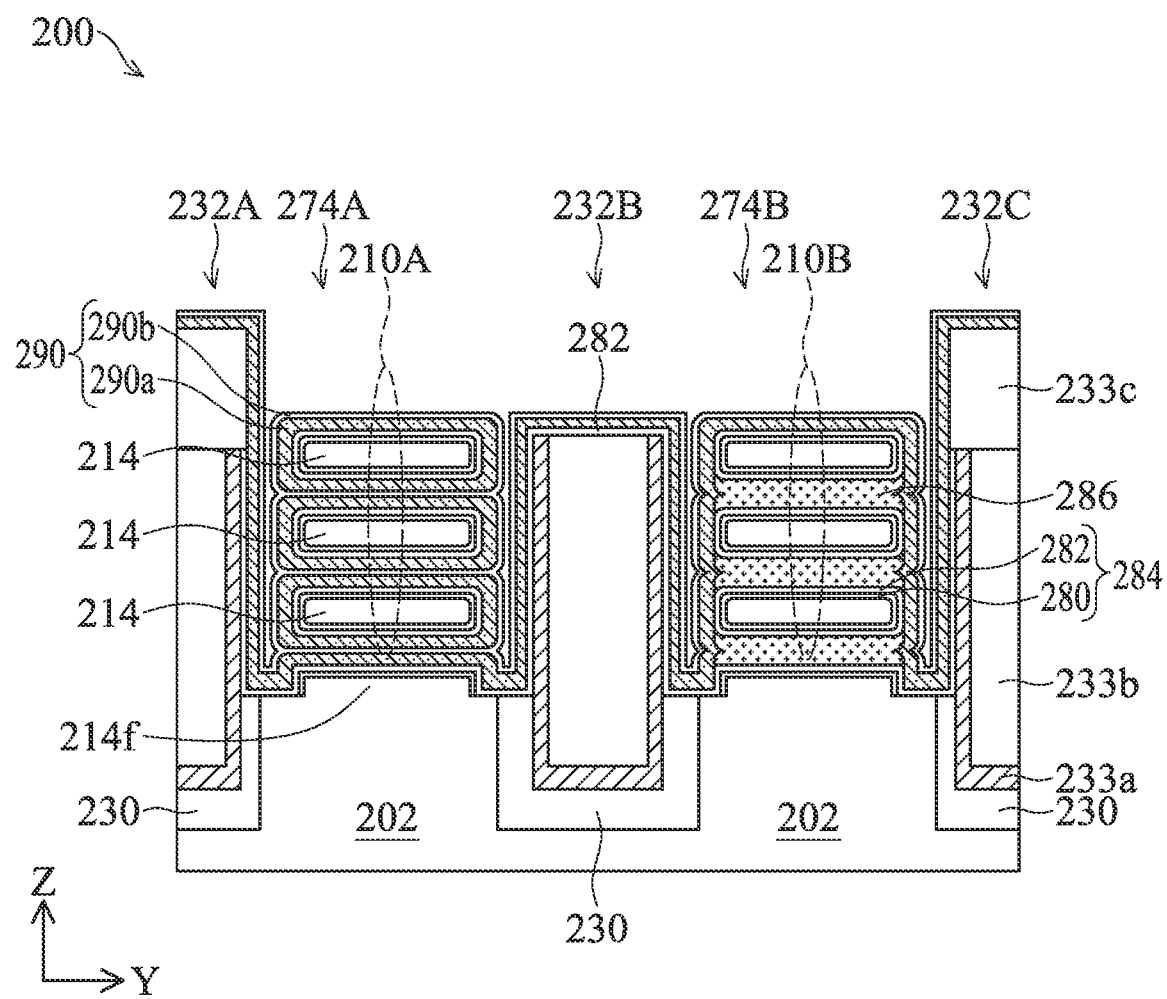
Figure 10A:
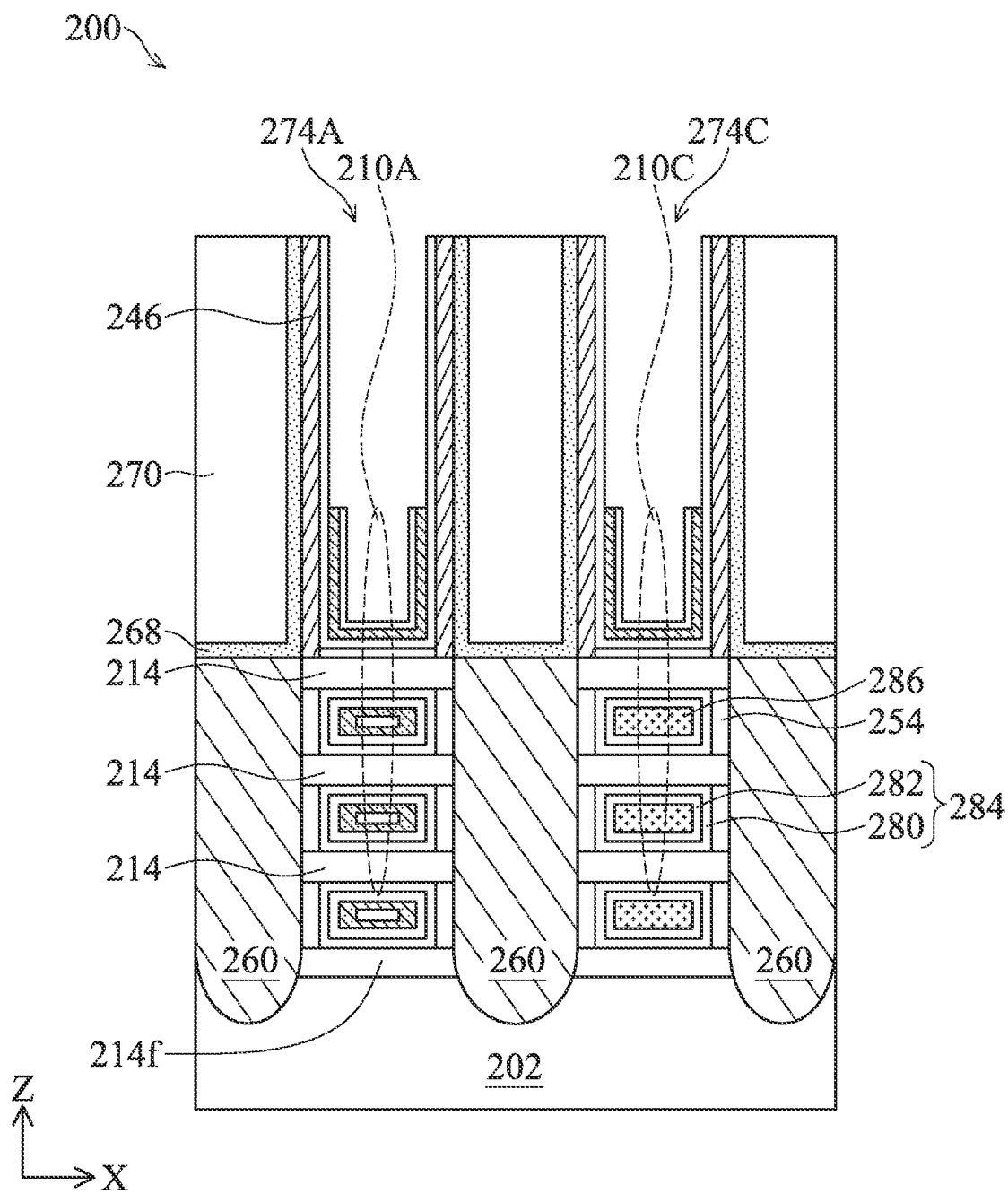
Figure 10B:
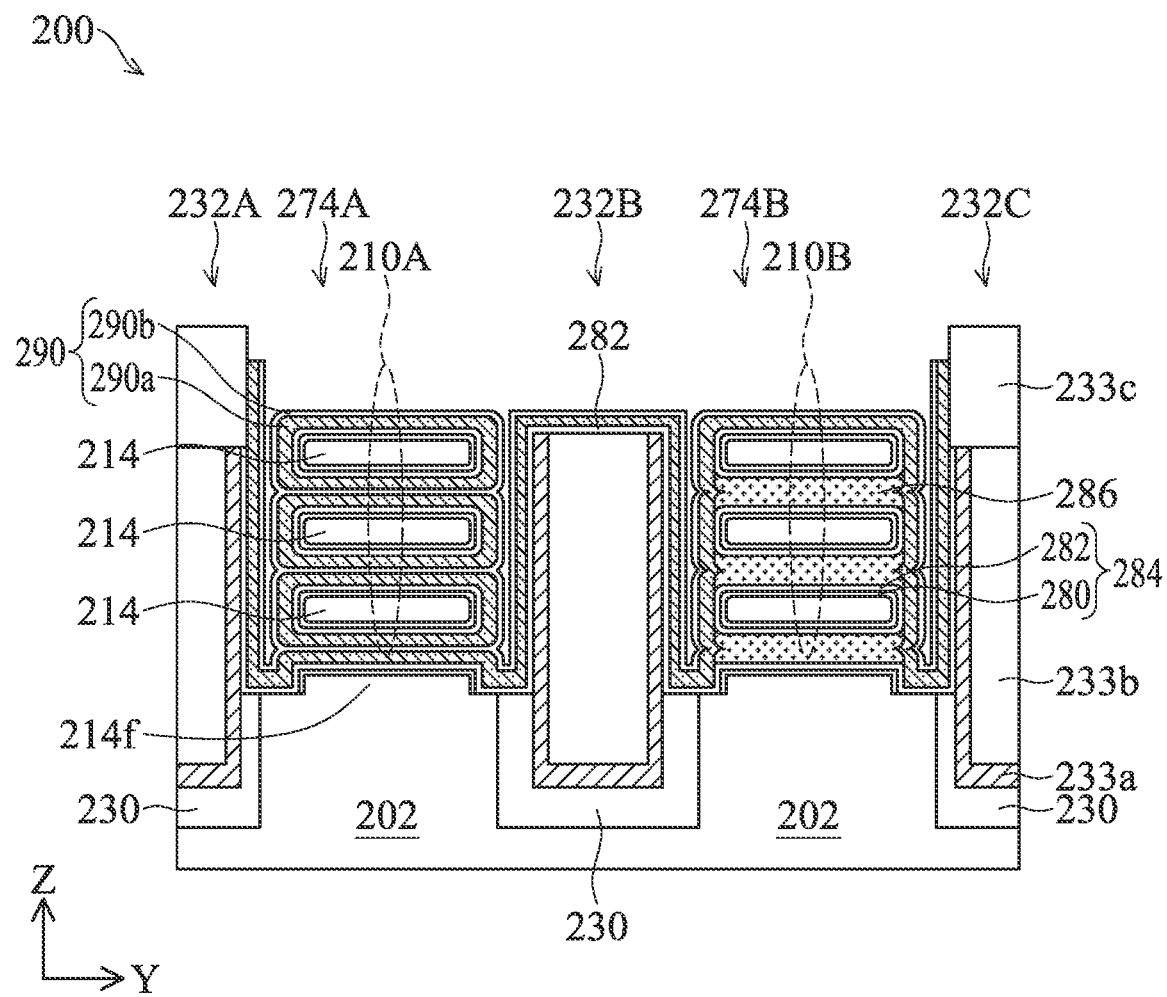

At operation 114, the method 100 (FIG. 1A) forms an n-type work function (WF) layer 290, such as shown in FIGS. 9A-B according to an embodiment. The n-type WF layer 290 is deposited over the high-k dielectric layer 282 in the gate trenches 274A in both the NFET regions and PFET regions. The n-type WF layer 290 is also deposited over the dummy fins 232 and over the dielectric layer 286 in the gate trenches 274B-C. In some embodiments, the n-type WF layer 290 includes one or more n-type work function metals for n-type transistors, such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function material, or combinations thereof. In some embodiments, the n-type WF layer 290 has a thickness of about 1 nm to about 4 nm. The n-type WF layer 290 may be deposited using ALD, CVD, PVD, or other suitable processes. In some embodiments, the n-type WF layer 290 is one layer of n-type work function metal, such as a layer of TiN. In some embodiments, the n-type WF layer 290 includes multiple layers of n-type work function metals. In the illustrated embodiment, the n-type WF layer 290 includes a first n-type WF layer 290a deposited on the high-k dielectric layer 282 and a second n-type WF layer 290b deposited on the first n-type WF layer 290a. The deposition of the first n-type WF layer 290a and the second n-type WF layer 290b may be in-situ, where no vacuum-break occurs during the deposition. In one example, the first n-type WF layer 290a includes TiAl and the second n-type WF layer 290b includes TiN. As depicted, in the gate trench 274A, the n-type WF layer 290 completely fills the gaps 276 between the adjacent channel layers 214 of the stack 210A. For example, in the gaps 276 the second n-type WF layer 290b deposited on adjacent channel layers 214 connects. As a comparison, in the gate trenches 274B-C, the n-type WF layer 290 is deposited on sidewalls and top surface of the stacks 210B-C as the gaps 276 in the PFET regions are still reserved by the dielectric layer 286. The remaining portions of the dielectric layer 286 blocks the n-type WF metals from entering the gaps 276 in the PFET regions. Otherwise, the n-type WF metals may become difficult to remove from the gaps 276 in the PFET regions in subsequent processes. In another embodiment, the n-type WF layer 290 does not completely fill the gaps 276 between the adjacent channel layers 214 in the NFET regions. After the deposition the n-type WF layer 290, the n-type WF layer 290 may be etched back so that the top portion of the high-k dielectric layer 282 and top surfaces of the dummy fins 232A and 232C are exposed. The resultant structure is shown in FIGS. 10A-B. The top portion of the n-type WF layer 290 may be lower than the top surfaces of the dummy fins 232A and 232C for about 2 nm to about 10 nm in one example.

Figure 11A:
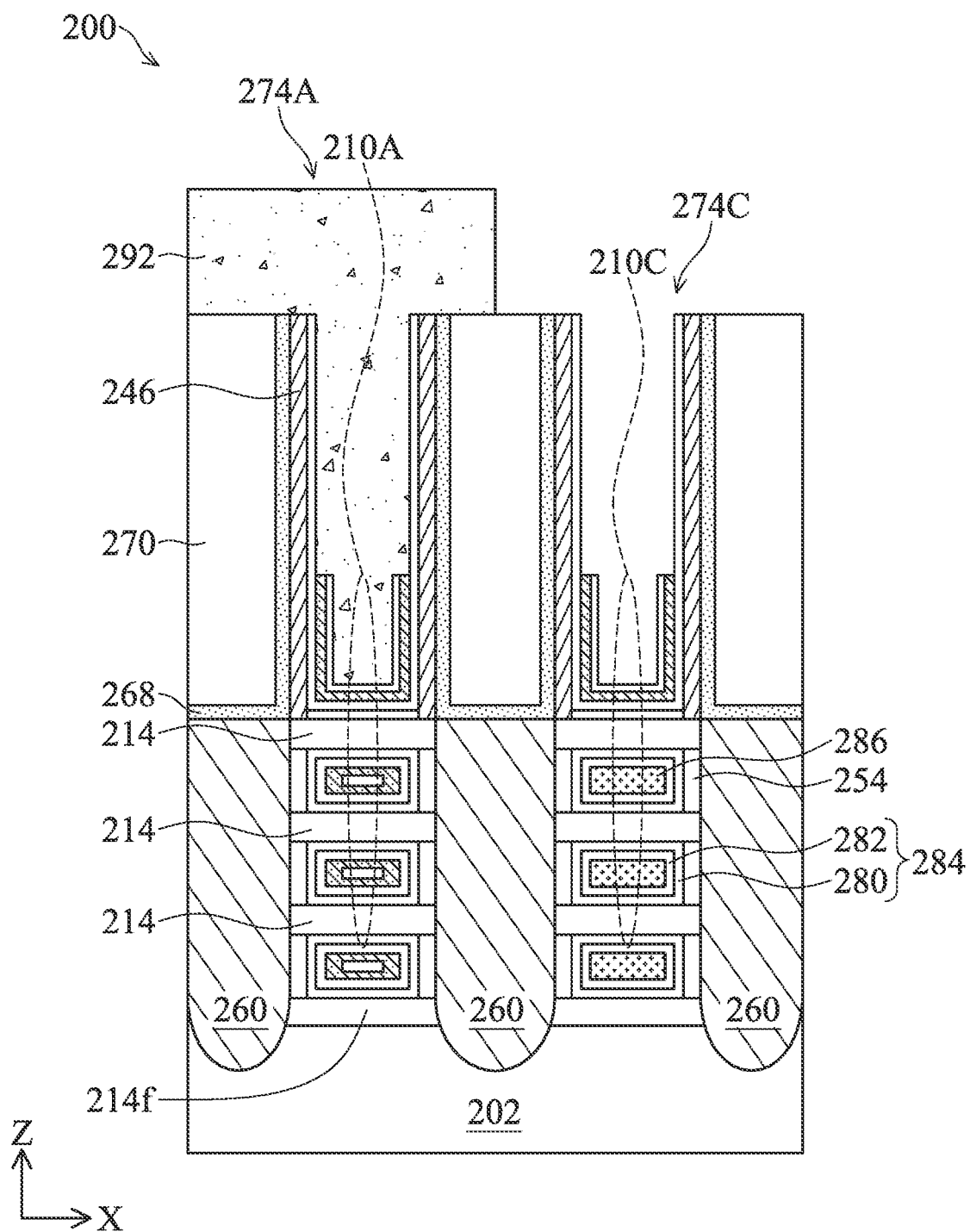
Figure 11B:
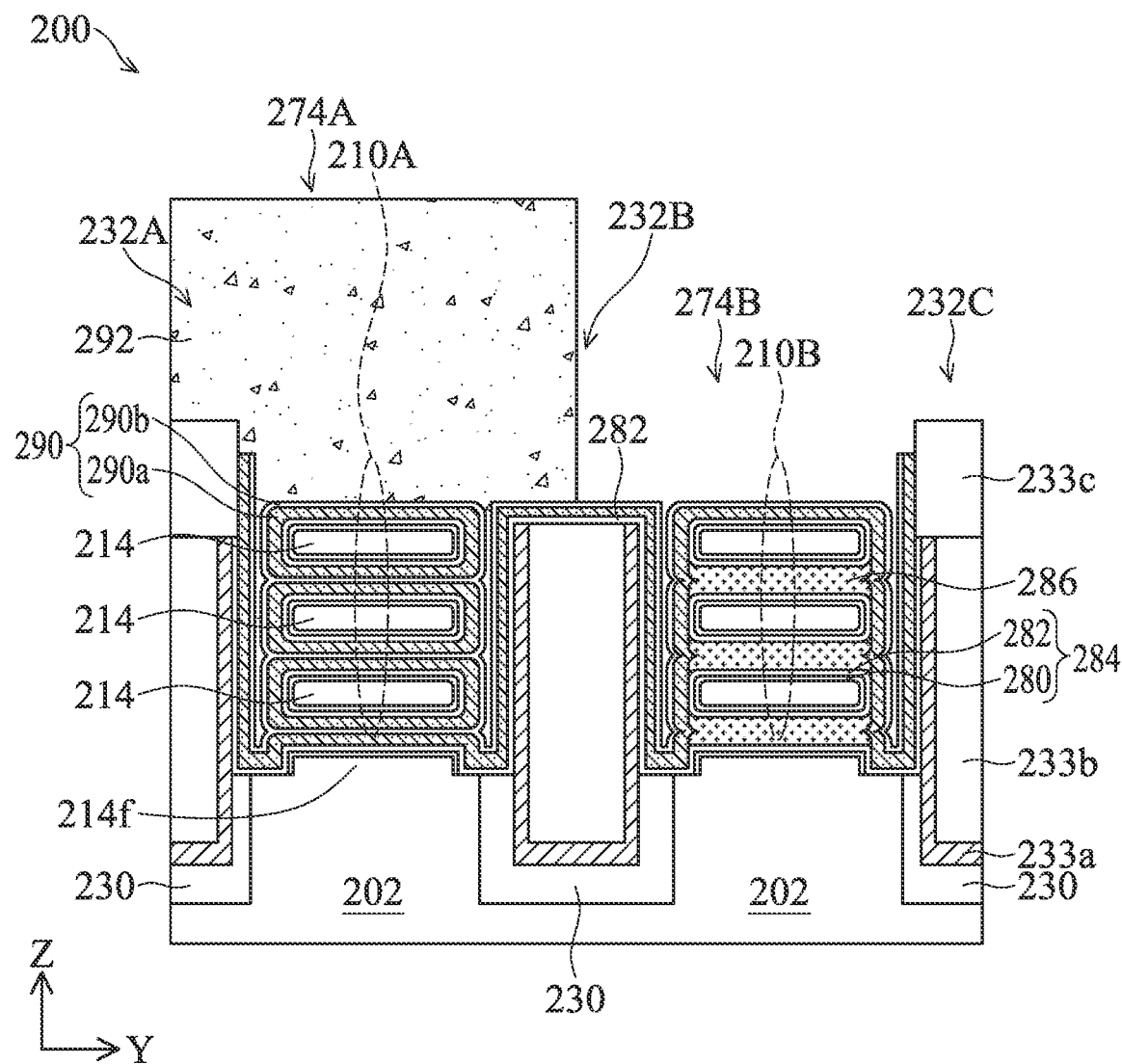

At operation 116, the method 100 (FIG. 1B) forms a patterned etch mask layer 292 over the device 200 with openings exposing the PFET regions, such as shown in FIGS. 11A-B according to an embodiment. As depicted, a patterned etch mask layer 292 covers the gate trenches 274A with openings exposing the gate trenches 274B-C. In some embodiments, the etch mask layer 292 may include a bottom anti-reflective coating (BARC) material that provides a platform for photoresist coating and photoresist patterning, as well as provides etch selectivity with respect to the n-type WF layer 290 and the dielectric layer 286. In an embodiment, the etch mask layer 292 is formed by spin coating a BARC material over the n-type WF layer 290 and baking the BARC material (for example, at a temperature in a range about 100° C. to about 200° C.) to cause cross-linking within the BARC material. Subsequently, the etch mask layer 292 is patterned to form openings exposing the gate trenches 274B-C and the stacks 210B-C therein, while rest of the etch mask layer 292 still covers the stack 210A. In an embodiment, the patterning of the etch mask layer 292 includes a lithography process that forms a resist (or photoresist) layer over the etch mask layer 292 by spin coating, performs a pre-exposure baking process, performs an exposure process, perform a post-exposure baking process, and develops the exposed resist layer in a developer solution. After the development, the resist layer becomes a resist pattern that corresponds with the photomask. The exposure process can be implemented using a photomask or using a maskless lithography process such as e-beam writing, ion-beam writing, or combinations thereof. Using the resist pattern as an etch mask, the operation 116 etches the etch mask layer 292 (for example, using an anisotropic etching process) to form the openings over the PFET regions.

Figure 12A:
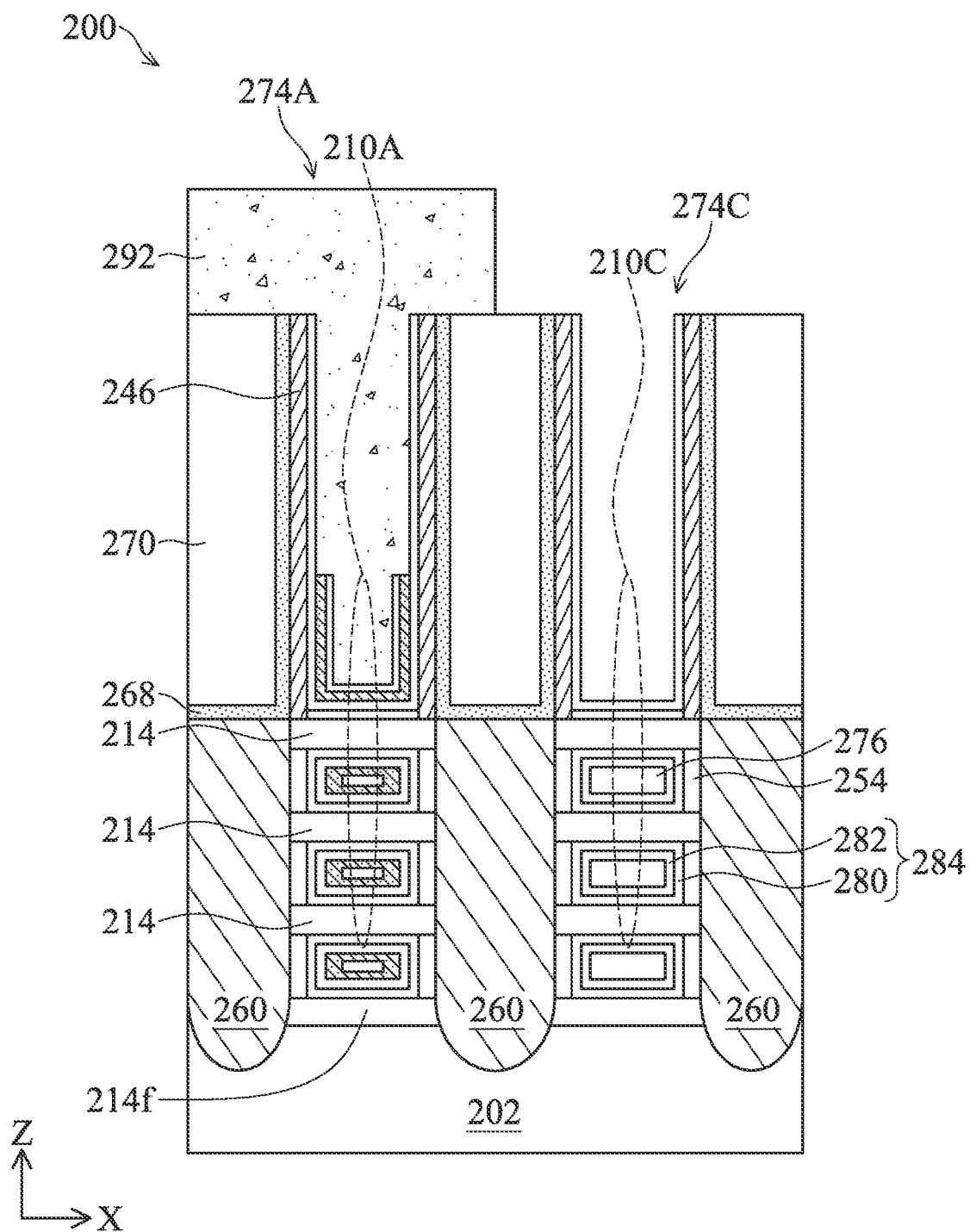
Figure 12B:
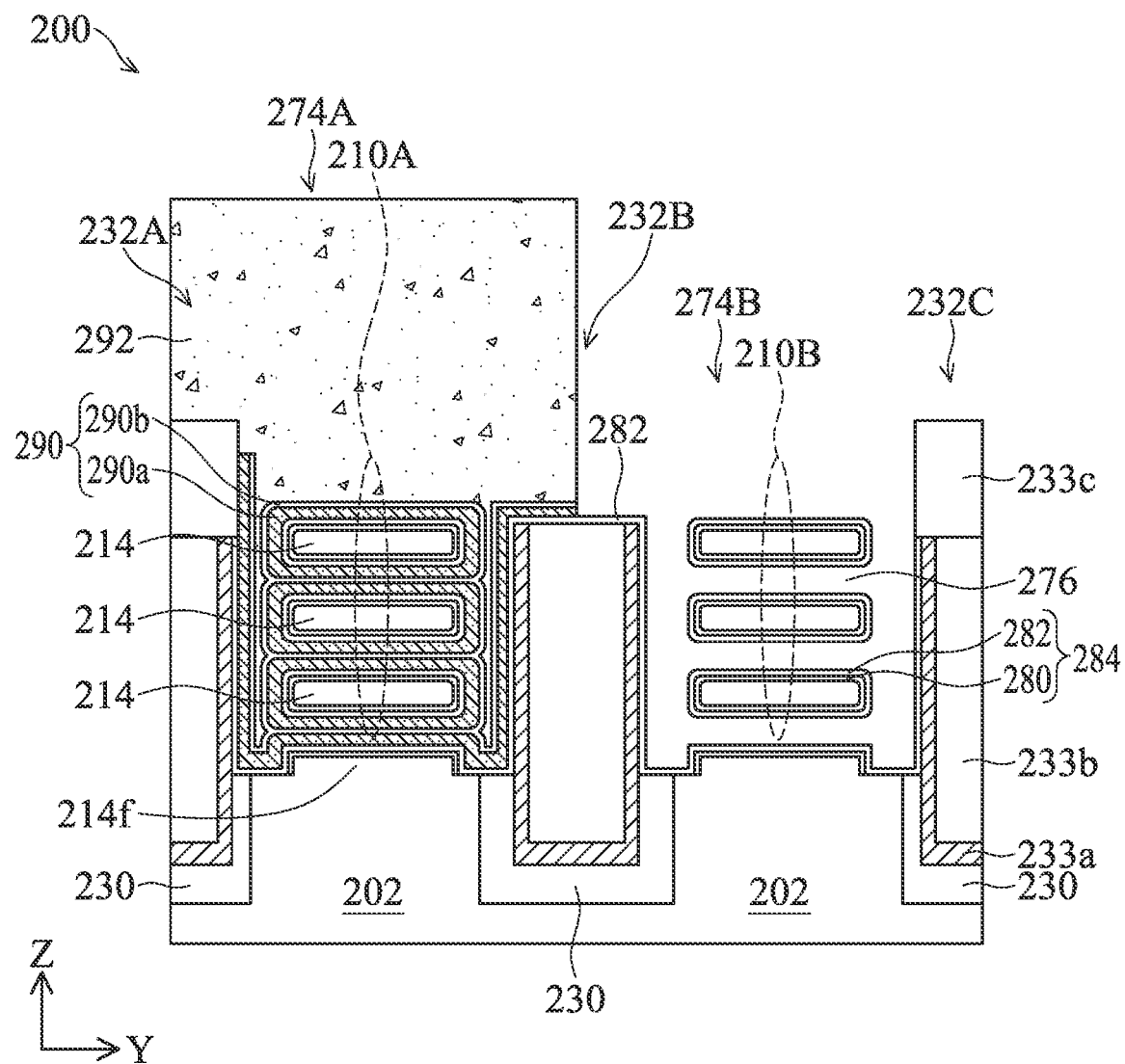

At operation 118, the method 100 (FIG. 1B) removes the n-type WF layer 290 and the remaining portions of the dielectric layer 286 from the PFET regions, such as shown in FIGS. 12A-B according to an embodiment. The removal of the n-type WF layer 290 and the dielectric layer 286 exposes the gaps 276 between the channel layers 214 in the gate trenches 274B-C. The n-type WF layer 290 and the dielectric layer 286 may be removed in one or a series of etching processes. The etching processes may implement wet etching, dry etching, or a combination thereof. In one example, the n-type WF layer 290 is etched in a first wet etching process, that applies etchants such as $HCl:H_2O_2$. The removal of the n-type WF layer 290 exposes the high-k dielectric layer 282 in the gate trenches 274B-C, including portions on the top surface of the dummy fin 232B. Subsequently, the dielectric layer 286 is etched in a second wet etching process, that applies etchants such as ammonium hydroxide ($NH_4OH$), tetramethylammonium hydroxide (TMAH), ethylenediamine pyrocatechol (EDP), or potassium hydroxide (KOH) solutions. In one example, the etching of the dielectric layer 286 includes a wet etching process with etchant of $NH_4OH:H_2O_2$ in a ratio ranging from about 1:10 to 1:30 for a duration of 150 seconds to about 400 seconds. After the removal of the dielectric layer 286, operation 118 removes the patterned etch mask layer 292 from the NFET regions, for example, using stripping or ashing.

Figure 13A:
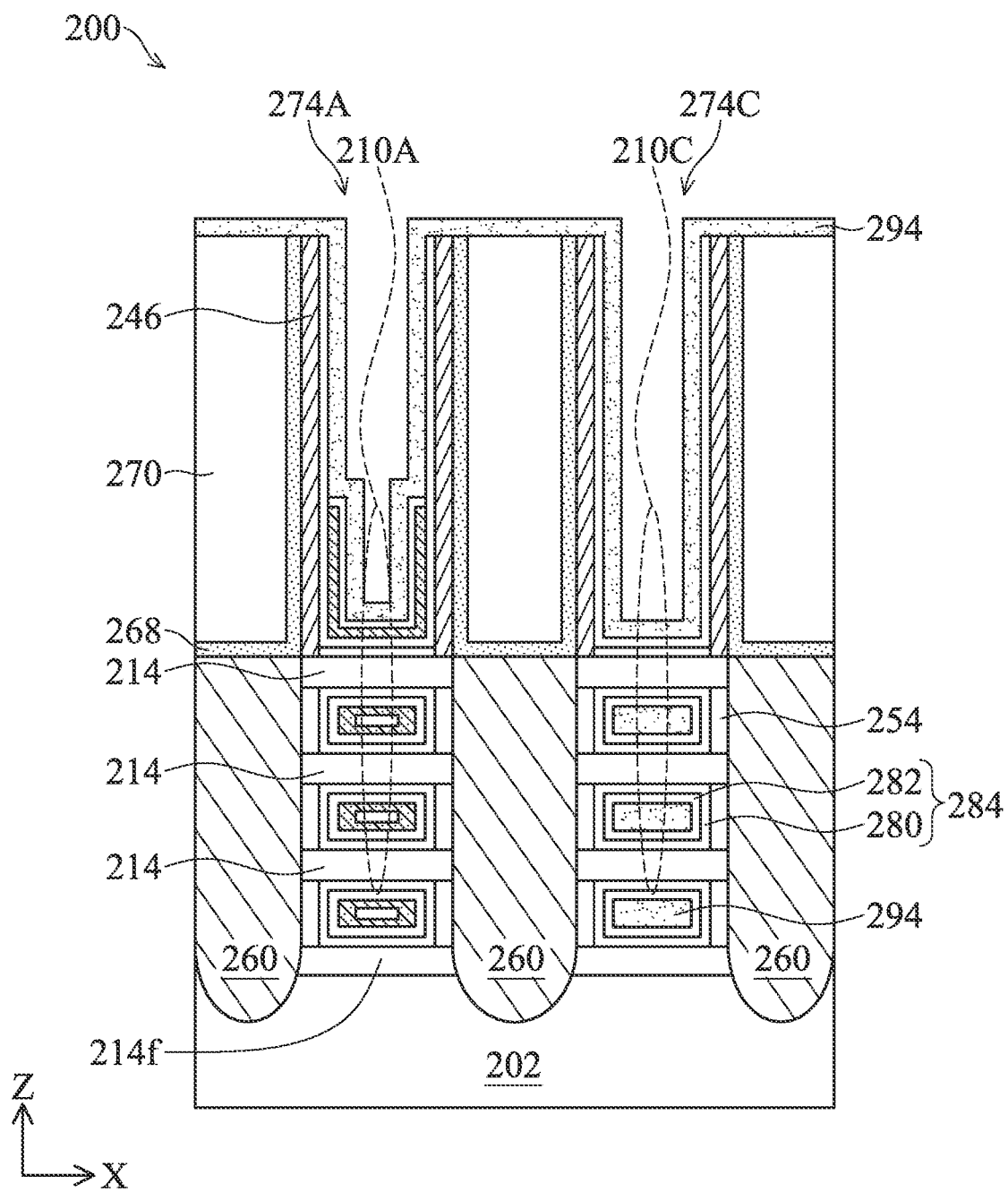
Figure 13B:
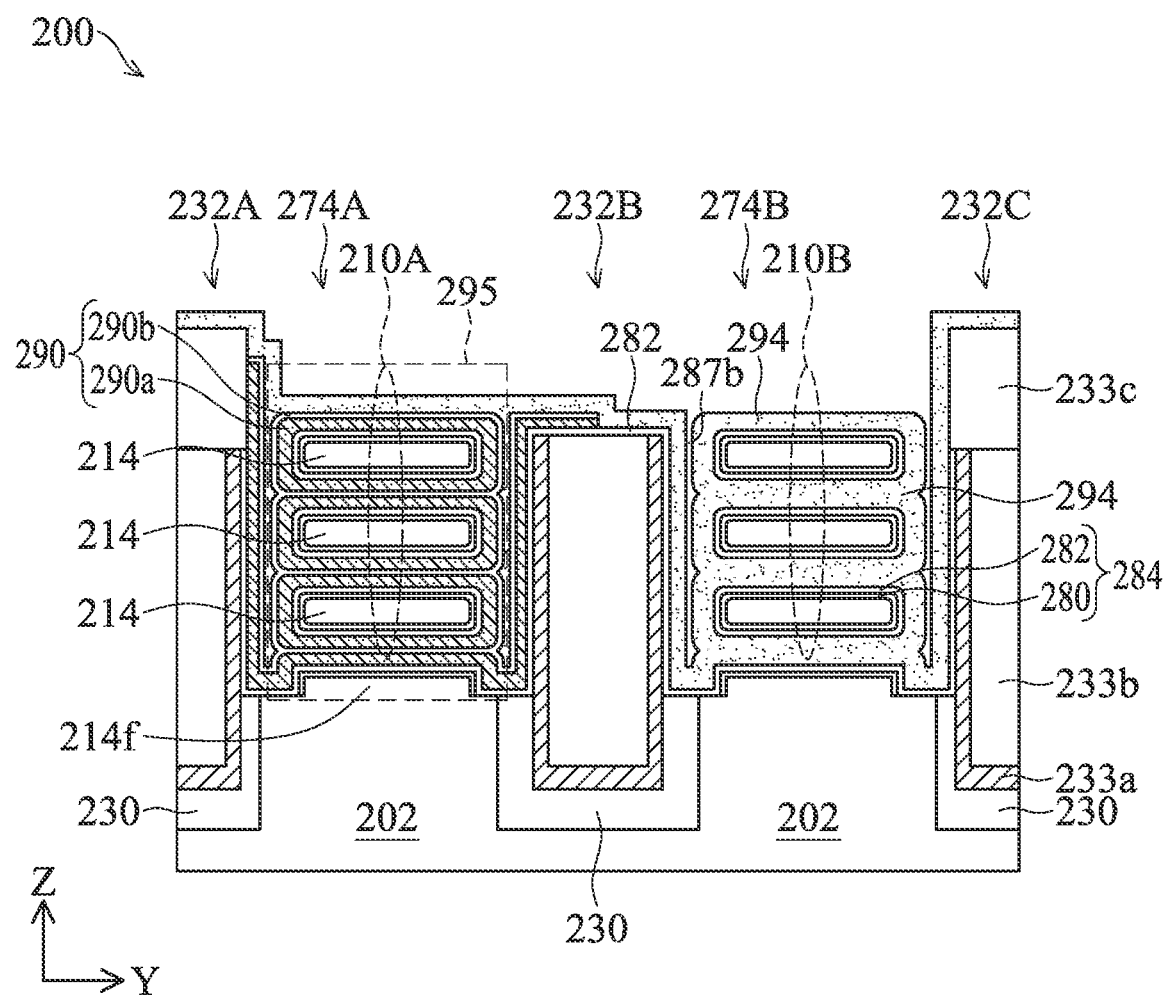

At operation 120, the method 100 (FIG. 1B) forms a p-type WF layer 294 in both the NFET regions and PFET regions, such as shown in FIGS. 13A-B according to an embodiment. The p-type WF layer 294 is deposited over the high-k dielectric layer 282 that is over the stacks 210B-C of the channel layers 214 in the gate trenches 274B-C. In an embodiment, the p-type WF layer 294 completely fills the gaps 276 between the adjacent channel layers of the stacks 210B-C. In another embodiment, the p-type WF layer 294 does not completely fill the gap 276 between the adjacent channel layers of the stacks 210B-C. The p-type WF layer 294 is also deposited over the dummy fins 232 and over the n-type WF layer 290 in the gate trench 274A. In some embodiments, the p-type WF layer 294 includes one or more p-type work function metals for p-type transistors, such as TiN, TaN, TaSN, Ru, Mo, Al, WN, WCN $ZrSi_2$, $MoSi_2$, $TaSi_2$, $NiSi_2$, other p-type work function material, or combinations thereof. In some embodiments, the p-type WF layer 294 has a thickness of about 1 nm to about 4 nm. The p-type WF layer 294 may be deposited using ALD, CVD, PVD, or other suitable processes. In some embodiments, the p-type WF layer 294 is one layer of p-type work function metal. In some embodiments, the p-type WF layer 294 includes multiple layers of p-type work function metals. As depicted, due to the preexisting of the n-type WF layer 290 in the NFET regions, there is less room for the p-type WF layer 294 compared with the PFET regions, such that the p-type WF layer 294 may completely fill the space between the dummy fins 232A-B and the stack 210A. As a comparison, seams 287b may still remain between the dummy fins 232B-C and the stack 210B. Also as depicted, as the n-type WF layer 290 fills the gaps 276 in the NFET regions, the p-type WF layer 294 is deposited on sidewalls and top surface of the stack 210A in the NFET regions. As a comparison, the p-type WF layer 294 wraps around the channel layers 214 in the stacks 210B-C in the PFET regions.

The n-type WF layer 290 and the p-type WF layer 294 are designed to provide different work functions. For example, the n-type WF layer 290 provides an n-type work function and the p-type WF layer 294 provides a p-type work function. However, since the p-type WF layer 294 covers the n-type WF layer 290, it fine tunes the work function of the n-type WF layer 290. One reason is that oxygen in the p-type WF layer 294 may diffuse into the n-type WF layer 290, shifting the work function provided by the n-type WF layer 290 by causing n-type WF metal oxidation. Thus, a concentration of oxygen (e.g., in atom percentage) decreases gradually in a direction from the p-type WF layer 294 towards the n-type WF layer 290 according to some embodiments.

FIGS. 15A-D illustrate magnified views of the region 295 in FIG. 13B, which includes the stack 210A over the semiconductor fin base 214f, according to various embodiments. Referring to FIG. 15A, in some embodiments, the n-type WF layer 290 includes a first n-type WF layer 290a deposited on the high-k dielectric layer 282 and a second n-type WF layer 290b deposited on the first n-type WF layer 290a, and the p-type WF layer 294 includes a first p-type WF layer 294a deposited on the second n-type WF layer 290b and a second p-type WF layer 294b deposited on the first p-type WF layer 294a. In some embodiments, the first p-type WF layer 294a has a thickness from about 0.5 nm to about 2 nm, and the second p-type WF layer 294b has a thickness larger than the first p-type WF layer 294a, such as from about 1 nm to about 4 nm. In the illustrated embodiment, the first n-type WF layer 290a is a layer of TiAl, the second n-type WF layer 290b is a layer of TiN that is in-situ deposited on the layer of TiAl, the first p-type WF layer 294a is a layer of TiN, and the second p-type WF layer 294b is a layer of TaN. In an alternative embodiment, the first p-type WF layer 294a is a layer of TiN, and the second p-type WF layer 294b is a layer of tungsten carbon nitride (WCN). Although the second n-type WF layer 290b and the first p-type WF layer 294a both include TiN, the first p-type WF layer 294a is deposited with vacuum-break occurs. Thus, the first p-type WF layer 294a has a higher concentration of oxygen atoms than the second n-type WF layer 290b. The diffusion of oxygen atoms into the second n-type WF layer 290b increases Vt of an NFET by causing n-type WF metal oxidation.

Figure 15B:
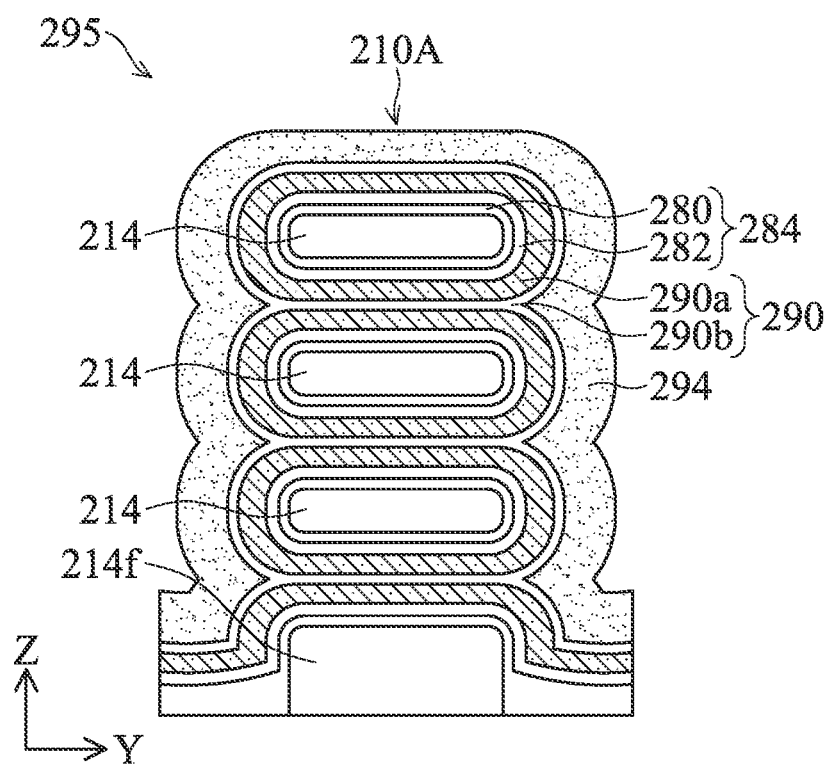

Referring to FIG. 15B, in some embodiments, the n-type WF layer 290 includes a first n-type WF layer 290a deposited on the high-k dielectric layer 282 and a second n-type WF layer 290b deposited on the first n-type WF layer 290a, and the p-type WF layer 294 includes a single layer of work function metal, such as a layer of TiN, or a layer of tungsten carbon nitride (WCN), or a layer of cobalt (Co). In the illustrated embodiment, the first n-type WF layer 290a is a layer of TiAl, the second n-type WF layer 290b is a layer of TiN that is in-situ deposited on the layer of TiAl, the p-type WF layer 294 is a layer of TiN that is thicker than the second n-type WF layer 290b. Although the second n-type WF layer 290b and the p-type WF layer 294 both include TiN, the p-type WF layer 294 is deposited with vacuum-break occurs. Thus, the p-type WF layer 294 has a higher concentration of oxygen atoms than the second n-type WF layer 290b. The diffusion of oxygen atoms into the second n-type WF layer 290b increases Vt of an NFET by causing n-type WF metal oxidation. In furtherance of some embodiments, the p-type WF layer 294 is formed by depositing multiple thinner layers of TiN with vacuum-break occurs during each deposition. For example, the p-type WF layer 294 may be formed by depositing a first layer of TiN with vacuum-break occurs, followed by depositing a second layer of TiN with vacuum-break occurs, and followed by depositing a third layer of TiN with vacuum-break occurs. The repeating of vacuum-breaks introduces more oxygen atoms into the n-type work function layer 290 and increases Vt of an NFET by causing n-type WF metal oxidation.

Figure 15C:
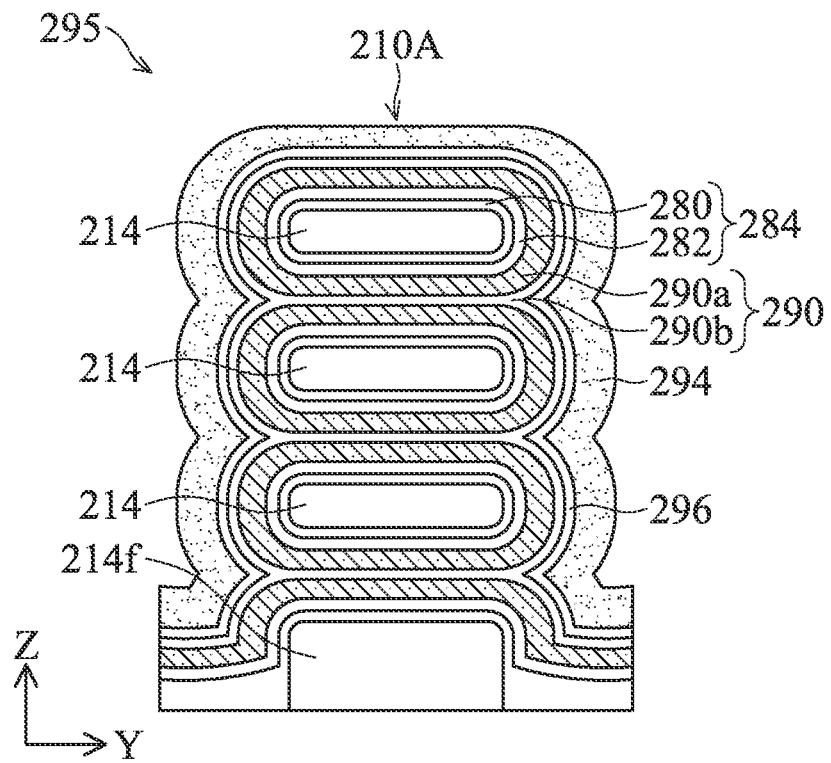

Referring to FIG. 15C, in some embodiments, the n-type WF layer 290 includes a first n-type WF layer 290a deposited on the high-k dielectric layer 282 and a second n-type WF layer 290b deposited on the first n-type WF layer 290a; a WF isolation layer 296 is deposited on the second n-type WF layer 290b; and the p-type WF layer 294 is deposited on the WF isolation layer 296. Although the p-type WF layer 294 is depicted as a single layer similar as in FIG. 15B, it may alternatively include multiple layers similar as in FIG. 15A. The WF isolation layer 296 is deposited on sidewalls and top surface of the stack 210A. In some embodiments, the WF isolation layer 296 includes semiconductive material, such as silicon (Si), germanium (Ge), silicon germanium (SiGe), gallium arsenide (GaAs), indium phosphide (InP), or other suitable semiconductive material. The WF isolation layer 296 may be formed by a chemical vapor deposition (CVD) process or an atomic layer deposition (ALD) process. In furtherance of the embodiments, the WF isolation layer 296 is a silicon (Si) layer. In one example, the silicon layer includes polysilicon. In another example, the silicon layer includes amorphous silicon. Silane (SiH$_4$) can be employed as a chemical gas in the CVD or ALD process to form the silicon layer. In one embodiment, the WF isolation layer 296 is formed by a highly conformal deposition process such as ALD in order to ensure a uniform growth rate everywhere on surfaces of the stack 210A. The WF isolation layer 296 has strong oxygen affinity, which prevents oxygen diffusion into the n-type WF layer 290 and mitigates Vt shifting otherwise caused by the n-type WF metal oxidation.

Figure 15D:
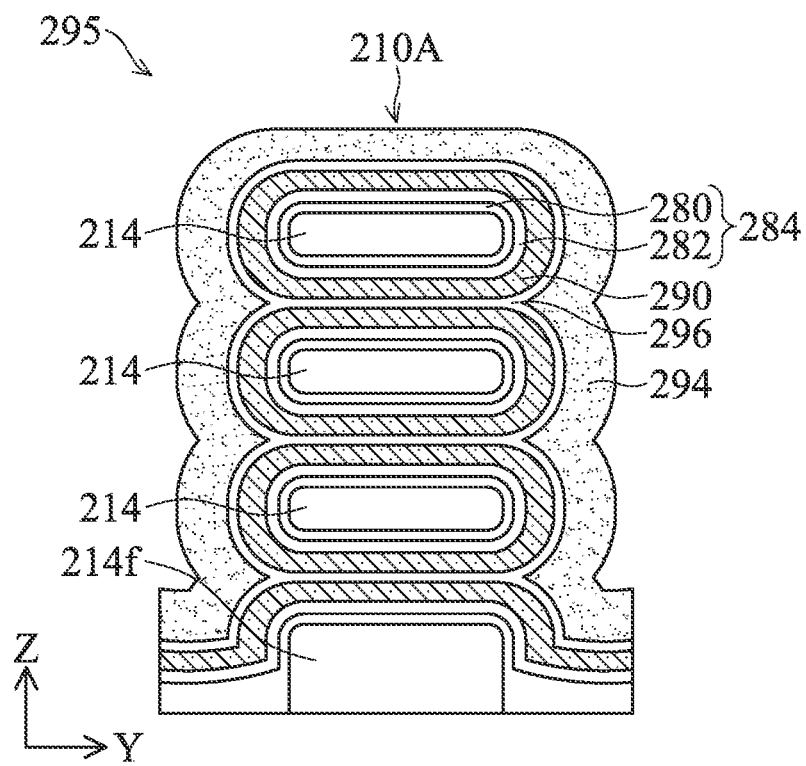

Referring to FIG. 15D, in some embodiments, the n-type WF layer 290 is a single layer of n-type WF metal, such as a layer of TiN, which does not fully fill the gaps 276 between adjacent channel layers 214. The WF isolation layer 296 is deposited on the n-type WF layer 290 and also in the gaps 276 such that it wraps around the channel layers 214. The p-type WF layer 294 is subsequently deposited on the WF isolation layer 296. Although the p-type WF layer 294 is depicted as a single layer similar as in FIG. 15B, it may alternatively include multiple layers similar as in FIG. 15A. As discussed above, the WF isolation layer 296 has strong oxygen affinity, which prevents oxygen diffusion into the n-type WF layer 290 and mitigates Vt shifting otherwise caused by the n-type WF metal oxidation.

Reference is now made to FIG. 16. FIG. 16 illustrates a bar chart of NFET Vt shifting by depositing a WF isolation layer and/or different p-type WF layers on the same n-type WF layer. The annotation "ashing" above a bar represents prior to the deposition of the p-type WF layer the etch mask layer 292 (FIGS. 12A-B) is removed in an ashing process at the conclusion of operation 118. Referring to the bar chart, the bar to the most left indexed "with WF isolation layer" has a height that is almost zero. As a comparison, all other bars to its right, which are the ones without a WF isolation layer, have a height larger than zero. One observation is that the WF isolation layer effectively mitigates NFET Vt shifting, such that Vt is insensitive to the material composition of the p-type WF layer. Another observation is that depositing the p-type WF layer on the n-type WF layer generally increases the Vt if the WF isolation layer is not presented. Comparing the bars with the annotation "ashing" with the counterpart ones with the same p-type WF layer but without the annotation "ashing," the bars with the annotation "ashing" are higher. Thus, a third observation is that an ashing process generally further increases Vt. This may be due to extra oxidation of the n-type WF metal during an ashing process, such that oxygen concentration is increased in the n-type WF metal prior to the depositing of the p-type WF layer. Comparing the bars with different p-type WF layers, yet another observation is that the amount of Vt shifting relates with the material composition of the p-type WF layer, as the bars indexed "p-type WF layer: TiN (3 layers)" are higher than the bars indexed "p-type WF layer: TiN+TaN", and the bars indexed "p-type WF layer: TiN+WCN" is higher than the bars indexed "p-type WF layer: TiN (3 layers)". That is, under the same etch mask layer 292 removal process (with or without "ashing"), the p-type WF layer with three layers of TiN shifts Vt higher than the p-type WF layer of a layer of TiN and a layer of TaN, and the p-type WF layer with a layer of TiN and a layer of WCN shifts Vt even higher.

According to the bar chart in FIG. 16, as bars representing depositing a WF isolation layer and/or different p-type WF layers with or without "ashing" process have different heights that translates to different amount of NFET Vt shifting, Vts of NFETs can be tuned by selecting suitable p-type WF layers to be deposited on the n-type WF layer with suitable etch mask layer 292 removal process. As the bar to the most left indexed "with WF isolation layer" has the lowest height, the WF isolation layer can also be deposited on the n-type WF layer to achieve a lower Vt. Such an example is illustrated in FIG. 17. FIG. 17 shows three regions, two NFET regions (i.e., NFET region I and NFET region II) and one PFET region, of the device 200. The NFETs in the two NFET regions have NFET Vts and the PFET in the PFET region has a PFET Vt. The n-type WF layer 290 in the NFET regions I and II are the same, and the p-type WF layer 294 in all the three regions are the same. The NFET region I is further deposited with a WF isolation layer 296 separating the n-type WF layer 290 from the p-type WF layer 294. Accordingly, the NFET in the NFET region I has a smaller NFET Vt than the NFET in the NFET region II. The NFET in the NFET region I may be suitable for a standard Vt device and the NFET in the NFET region II may be suitable for a high Vt device. Alternatively, NFET in the NFET region I may be suitable for a low Vt device and the NFET in the NFET region II may be suitable for a standard Vt device. The example regions are for illustrative purpose and non-limiting. In some other embodiments, the device 200 may have three NFET regions and one PFET regions. One NFET region includes a WF isolation layer for providing a low Vt device, and the other two NFET regions include two different p-type WF layers (e.g., a p-type WF layer of TiN+TaN in one region and a p-type WF layer of TiN+WCN in another region) for providing a standard Vt device and a high Vt device, respectively.

Figure 14A:
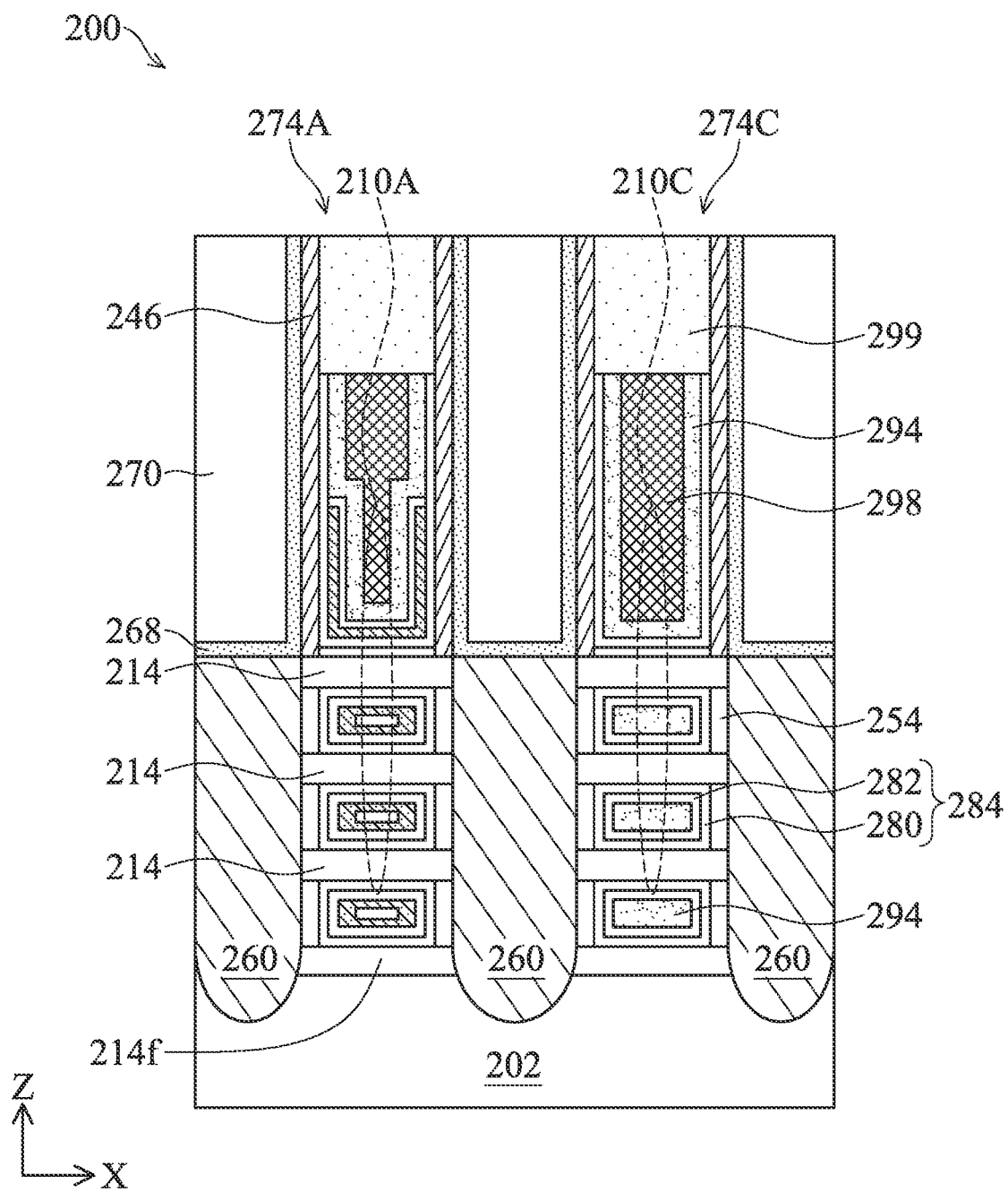
Figure 14B:
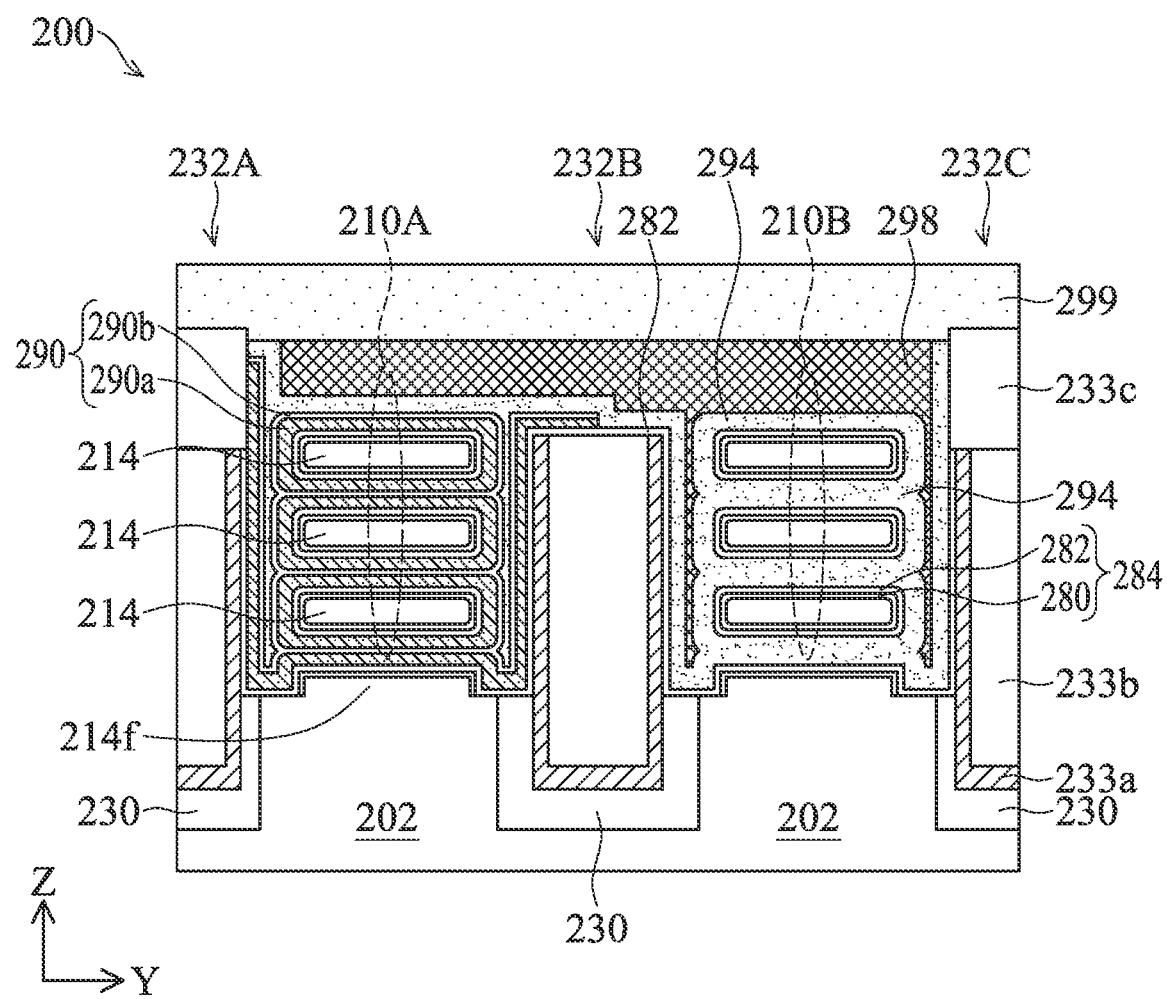

Referring back to FIG. 1B, at operation 122, the method 100 forms a gate electrode layer 298 over the p-type WF layer 294 in both the NFET regions and PFET regions, such as shown in FIGS. 14A-B according to an embodiment. The gate electrode layer 298 may be deposited using ALD, CVD, PVD, plating, or other suitable processes to fill any remaining portion of gate trenches 274. The gate electrode layer 298 includes a suitable conductive material, such as Al, W, and/or Cu. The gate electrode layer 298 may additionally or collectively include other metals, metal oxides, metal nitrides, other suitable materials, or combinations thereof. In some implementations, a barrier layer (not shown) is optionally formed (e.g., by ALD) over the p-type WF layer 294 before forming the gate electrode layer 298, such that the gate electrode layer 298 is disposed on the barrier layer. As depicted in FIG. 14B, the gate electrode layer 298 is deposited above the p-type WF layer 294 in the NFET regions, as the p-type WF layer 294 may fill up the seams between the dummy fins 232 and the stack 210A, while the gate electrode layer 298 is deposited in the seams 287*b* in the PFET regions, such that a portion of the gate electrode layer 298 is laterally between the dummy fin 232 and the stack 210B. Also as depicted in FIG. 14B, the gate electrode layer 298 straddles the dummy fin 232B due to the prior removal of the dielectric helmet 233*c* from the dummy fin 232B. Thus, the gate electrode layer 298 engages stacks 210A-B on both sides of the dummy fin 232B, such that NFET and PFET share the same gate electrode layer 298. Accordingly, the high-k metal gate structure, including the WF layers and the gate electrode layer 298, is also referred to as a joint gate structure in such a configuration. The gate electrode layer 298 may be etched back so that the top surface of the gate electrode layer 298 is lower than the top surfaces of the dummy fins 232A and 232C. The dummy fins 232A and 232C on both sides of the joint gate structure function as gate isolation features that isolate the joint gate structure from other adjacent gate structures. After the etching back of the gate electrode layer 298, a self-aligned cap (SAC) layer 299 is deposited over the device 200 by CVD, PECVD, or a suitable deposition process. The SAC layer 299 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In various embodiments, a CMP process may be performed to remove excessive metal from the SAC layer 299, and thereby provide a substantially planar top surface of the device 200.

The device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide forming an n-type work function layer prior to forming a p-type work function layer, allowing the p-type work function layer to fine tune the work function provided by the n-type work function layer. Using embodiments of the present disclosure, work function layers in metal gate structures can be formed with a less stringent process control to achieve different threshold voltages more easily. Furthermore, the present embodiments can be readily integrated into existing CMOS fabrication processes.

In one exemplary aspect, the present disclosure is directed to a method. The method includes providing a structure having a substrate, a first stack of nanostructures spaced vertically one from another over a surface of the substrate, and a second stack of nanostructures spaced vertically one from another over the surface of the substrate, forming a dielectric layer wrapping around each of the nanostructures in the first and second stacks, depositing an n-type work function layer on the dielectric layer, the n-type work function layer wrapping around each of the nanostructures in the first stack, depositing a p-type work function layer on the n-type work function layer and over the first and second stacks, the p-type work function layer wrapping around each of the nanostructures in the second stack, and forming an electrode layer on the p-type work function layer and over the first and second stacks. In some embodiments, the depositing of the n-type work function layer includes depositing the n-type work function layer over the second stack. In some embodiments, the method further includes prior to the depositing of the p-type work function layer, removing the n-type work function layer from the second stack. In some embodiments, between the depositing of the n-type work function layer and the depositing of the p-type work function layer, a vacuum containing the structure is broken. In some embodiments, the depositing of the p-type work function layer increases an oxygen concentration in the n-type work function layer. In some embodiments, the n-type work function layer includes a layer of a conductive material and the p-type work function layer includes a layer of the conductive material, and the layer of the conductive material in the p-type work function layer has a higher oxygen concentration than the layer of the conductive material in the n-type work function layer. In some embodiments, the method further includes prior to the depositing of the p-type work function layer, depositing a work function isolation layer on the n-type work function layer. In some embodiments, the method further includes prior to the depositing of the n-type work function layer, forming a metal oxide layer filling gaps between the nanostructures in the second stack. In some embodiments, after the depositing of the n-type work function layer, the n-type work function layer fills gaps between the nanostructures in the first stack. In some embodiments, the method further includes after the depositing of the n-type work function layer and prior to the depositing of the p-type work function layer, performing an ashing process to the structure.

In another exemplary aspect, the present disclosure is directed to a method. The method includes providing a structure having a first region for forming transistors of a first conductivity type and a second region for forming transistors of a second conductivity type that is opposite to the first conductivity type, a first stack of semiconductor channel layers spaced vertically one from another in the first region, and a second stack of semiconductor channel layers spaced vertically one from another in the second region, forming a gate dielectric layer wrapping around each of the semiconductor channel layers in the first and second stacks, forming a dielectric layer in the second region filling gaps between the semiconductor channel layers in the second stack, depositing a first work function layer of the first conductivity type wrapping each of the semiconductor channel layers in the first stack in the first region and over the second stack in the second region, releasing the semiconductor channel layers in the second stack from the first work function layer and the dielectric layer, depositing a second work function layer of the second conductivity type on the first work function layer in the first region and wrapping each of the semiconductor channel layers in the second stack in the second region, and forming a gate electrode layer on the second work function layer in the first and second regions. In some embodiments, the transistors of the first conductivity type are n-type transistors and the transistors of the second conductivity type are p-type transistors. In some embodiments, the dielectric layer is a metal oxide layer. In some embodiments, the second work function layer is in physical contact with the first work function layer and increases an oxygen concentration in the first work function layer. In some embodiments, the method further includes depositing an isolation layer stacking on the first work function layer and separating the first work function layer from the second work function layer. In some embodiments, the structure includes a dielectric fin disposed between the first stack and the second stack, and a top surface of the dielectric fin has a first portion directly under the first work function layer and a second portion directly under the second work function layer.

In yet another exemplary aspect, the present disclosure is directed to an n-type field effect transistor. The n-type field effect transistor includes a substrate, a stack of semiconductor channel layers spaced vertically one from another over a surface of the substrate, an interfacial layer wrapping around each of the semiconductor channel layers in the stack, a high-k dielectric layer on the interfacial layer and wrapping around each of the semiconductor channel layers in the stack, an n-type work function layer on the high-k dielectric layer and wrapping around each of the semiconductor channel layers in the stack, a p-type work function layer on the n-type work function layer, an oxygen concentration in the p-type work function layer being higher than in the n-type work function layer, and a gate electrode layer on the p-type work function layer. In some embodiments, the n-type work function layer fills gaps between the semiconductor channel layers in the stack. In some embodiments, the n-type work function layer includes a layer of a conductive material, and the p-type work function layer includes a layer of the conductive material. In some embodiments, the conductive material is TiN.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a substrate, a first stack of nanostructures spaced vertically one from another over a surface of the substrate, and a second stack of nanostructures spaced vertically one from another over the surface of the substrate;
forming a dielectric layer wrapping around each of the nanostructures in the first and second stacks;
depositing an n-type work function layer on the dielectric layer, wherein the n-type work function layer wraps around each of the nanostructures in the first stack;
depositing a p-type work function layer on the n-type work function layer and over the first and second stacks, wherein the p-type work function layer wraps around each of the nanostructures in the second stack, wherein the depositing of the p-type work function layer increases an oxygen concentration in the n-type work function layer; and
forming an electrode layer on the p-type work function layer and over the first and second stacks.

2. The method of claim 1, wherein the depositing of the n-type work function layer includes depositing the n-type work function layer over the second stack.

3. The method of claim 2, further comprising:
prior to the depositing of the p-type work function layer, removing the n-type work function layer from the second stack.

4. The method of claim 1, wherein between the depositing of the n-type work function layer and the depositing of the p-type work function layer, a vacuum containing the structure is broken.

5. The method of claim 1, wherein the n-type work function layer includes a layer of a conductive material and the p-type work function layer includes a layer of the conductive material, and wherein the layer of the conductive material in the p-type work function layer has a higher oxygen concentration than the layer of the conductive material in the n-type work function layer.

6. The method of claim 1, further comprising:
prior to the depositing of the p-type work function layer, depositing a work function isolation layer on the n-type work function layer.

7. The method of claim 1, further comprising:
prior to the depositing of the n-type work function layer, forming a metal oxide layer filling gaps between the nanostructures in the second stack.

8. The method of claim 1, wherein after the depositing of the n-type work function layer, the n-type work function layer fills gaps between the nanostructures in the first stack.

9. The method of claim 1, further comprising:
after the depositing of the n-type work function layer and prior to the depositing of the p-type work function layer, performing an ashing process to the structure.

10. The method of claim 1, wherein the p-type work function layer is a multi-layer structure.

11. A method, comprising:
providing a structure having a first region for forming transistors of a first conductivity type and a second region for forming transistors of a second conductivity type that is opposite to the first conductivity type, a first stack of semiconductor channel layers spaced vertically one from another in the first region, and a second stack of semiconductor channel layers spaced vertically one from another in the second region;
forming a gate dielectric layer wrapping around each of the semiconductor channel layers in the first and second stacks;
forming a dielectric layer in the second region filling gaps between the semiconductor channel layers in the second stack;
depositing a first work function layer of the first conductivity type wrapping each of the semiconductor channel layers in the first stack in the first region and over the second stack in the second region;
releasing the semiconductor channel layers in the second stack from the first work function layer and the dielectric layer;
depositing a second work function layer of the second conductivity type on the first work function layer in the first region and wrapping each of the semiconductor channel layers in the second stack in the second region; and
forming a gate electrode layer on the second work function layer in the first and second regions.

12. The method of claim 11, wherein the transistors of the first conductivity type are n-type transistors and the transistors of the second conductivity type are p-type transistors.

13. The method of claim 11, wherein the dielectric layer is a metal oxide layer.

14. The method of claim 11, wherein the second work function layer is in physical contact with the first work function layer and increases an oxygen concentration in the first work function layer.

15. The method of claim 11, further comprising:
depositing an isolation layer stacking on the first work function layer and separating the first work function layer from the second work function layer.

16. The method of claim 11, wherein the structure includes a dielectric fin disposed between the first stack and the second stack, and wherein a top surface of the dielectric fin has a first portion directly under the first work function layer and a second portion directly under the second work function layer.

17. An n-type field effect transistor, comprising:
a substrate;
a stack of semiconductor channel layers spaced vertically one from another over a surface of the substrate;
an interfacial layer wrapping around each of the semiconductor channel layers in the stack;
a high-k dielectric layer on the interfacial layer and wrapping around each of the semiconductor channel layers in the stack;
an n-type work function layer on the high-k dielectric layer and wrapping around each of the semiconductor channel layers in the stack, wherein the n-type work function layer fills gaps between the semiconductor channel layers in the stack;
a p-type work function layer on the n-type work function layer, wherein an oxygen concentration in the p-type work function layer is higher than in the n-type work function layer; and
a gate electrode layer on the p-type work function layer.

18. The n-type field effect transistor of claim 17, wherein the n-type work function layer includes a layer of a conductive material, and the p-type work function layer includes a layer of the conductive material.

19. The n-type field effect transistor of claim 18, wherein the conductive material is TiN.

20. The n-type field effect transistor of claim 17, further comprising:
an isolation layer disposed between the n-type work function layer and the p-type work function layer.

* * * * *